United States Patent
Shimomura et al.

(10) Patent No.: US 8,283,238 B2
(45) Date of Patent: Oct. 9, 2012

(54) LAYER TRANSFER PROCESS FOR SEMICONDUCTOR DEVICE

(75) Inventors: Akihisa Shimomura, Isehara (JP); Tatsuya Mizoi, Atsugi (JP); Hidekazu Miyairi, Isehara (JP); Koichiro Tanaka, Isehara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 324 days.

(21) Appl. No.: 12/213,734

(22) Filed: Jun. 24, 2008

(65) Prior Publication Data

US 2009/0004823 A1    Jan. 1, 2009

(30) Foreign Application Priority Data

Jun. 28, 2007    (JP) .................................. 2007-170087

(51) Int. Cl.
  *H01L 21/30*    (2006.01)
  *H01L 21/46*    (2006.01)
(52) U.S. Cl. .................. 438/458; 257/E21.568
(58) Field of Classification Search .................. 438/455, 438/459, 478, 479, 458; 257/E21.567, E21.569, 257/E21.57, E21.568
See application file for complete search history.

(56) References Cited

U.S. PATENT DOCUMENTS

| | | | |
|---|---|---|---|
| 5,013,681 A | 5/1991 | Godbey et al. | |
| 5,852,488 A | 12/1998 | Takemura | |
| 6,004,866 A * | 12/1999 | Nakano et al. | 438/459 |
| 6,242,324 B1 | 6/2001 | Kub et al. | |
| 6,372,609 B1 | 4/2002 | Aga et al. | |
| 6,380,046 B1 | 4/2002 | Yamazaki | |
| 6,485,993 B2 | 11/2002 | Trezza et al. | |
| 6,534,380 B1 | 3/2003 | Yamauchi et al. | |
| 6,562,127 B1 | 5/2003 | Kud et al. | |
| 6,767,802 B1 * | 7/2004 | Maa et al. | 438/406 |
| 6,818,529 B2 * | 11/2004 | Bachrach et al. | 438/455 |
| 6,953,736 B2 | 10/2005 | Ghyselen et al. | |
| 7,038,277 B2 | 5/2006 | Chu et al. | |

(Continued)

FOREIGN PATENT DOCUMENTS

JP    01-061943 A    3/1989

(Continued)

OTHER PUBLICATIONS

International Search Report (Application No. PCT/JP2008/061499) Dated Sep. 30, 2008.

(Continued)

*Primary Examiner* — Matthew Landau
*Assistant Examiner* — Daniel Luke
(74) *Attorney, Agent, or Firm* — Eric J. Robinson; Robinson Intellectual Property Law Office, P.C.

(57) ABSTRACT

A manufacturing method of a semiconductor device in which a space between semiconductor films transferred to a plurality of places can be made small. Transfer of a semiconductor film from a bond substrate to a base substrate is carried out a plurality of times. In the case where a semiconductor film transferred first and a semiconductor film transferred later are provided adjacently, the latter transfer is carried out using a bond substrate with its end portion partially removed. The width in a perpendicular direction to the bond substrate used for the later transfer, of the region of the bond substrate corresponding to the removed end portion is larger than the thickness of the semiconductor film which is transferred first.

22 Claims, 19 Drawing Sheets

U.S. PATENT DOCUMENTS

| | | | |
|---|---|---|---|
| 7,119,365 B2 | 10/2006 | Takafuji et al. | |
| 7,148,124 B1 | 12/2006 | Usenko | |
| 7,176,528 B2 | 2/2007 | Couillard et al. | |
| 7,192,844 B2 | 3/2007 | Couillard et al. | |
| 7,199,024 B2 | 4/2007 | Yamazaki | |
| 7,315,064 B2 | 1/2008 | Mitani et al. | |
| 7,399,681 B2 | 7/2008 | Couillard et al. | |
| 7,508,034 B2 | 3/2009 | Takafuji et al. | |
| 7,655,566 B2 | 2/2010 | Fujii | |
| 7,674,687 B2 * | 3/2010 | Henley | 438/459 |
| 7,745,310 B2 | 6/2010 | Shimomura et al. | |
| 7,776,718 B2 | 8/2010 | Tanaka | |
| 7,795,627 B2 | 9/2010 | Yamazaki | |
| 7,825,007 B2 | 11/2010 | Yamazaki et al. | |
| 7,863,155 B2 | 1/2011 | Yamazaki et al. | |
| 7,989,316 B2 | 8/2011 | Shimomura et al. | |
| 2002/0109144 A1 | 8/2002 | Yamazaki | |
| 2003/0183876 A1 | 10/2003 | Takafuji et al. | |
| 2004/0056332 A1 | 3/2004 | Bachrach et al. | |
| 2004/0061176 A1 | 4/2004 | Takafuji et al. | |
| 2004/0121557 A1 * | 6/2004 | Ghyselen | 438/455 |
| 2004/0135149 A1 | 7/2004 | Cho et al. | |
| 2004/0147095 A1 | 7/2004 | Yamazaki | |
| 2004/0198026 A1 | 10/2004 | Chu et al. | |
| 2004/0229444 A1 | 11/2004 | Couillard et al. | |
| 2004/0248380 A1 | 12/2004 | Aulnette et al. | |
| 2004/0259328 A1 | 12/2004 | Ito et al. | |
| 2005/0148121 A1 | 7/2005 | Yamazaki et al. | |
| 2005/0210302 A1 | 9/2005 | Kato et al. | |
| 2005/0247932 A1 | 11/2005 | Huang et al. | |
| 2005/0255670 A1 | 11/2005 | Couillard et al. | |
| 2005/0266658 A1 | 12/2005 | Couillard et al. | |
| 2006/0108562 A1 | 5/2006 | Fukai | |
| 2007/0026580 A1 | 2/2007 | Fujii | |
| 2007/0026638 A1 | 2/2007 | Henley | |
| 2007/0117354 A1 | 5/2007 | Gadkaree et al. | |
| 2007/0120681 A1 | 5/2007 | Yamazaki et al. | |
| 2007/0134891 A1 * | 6/2007 | Adetutu et al. | 438/464 |
| 2007/0173000 A1 | 7/2007 | Yamazaki | |
| 2007/0207593 A1 | 9/2007 | Couillard et al. | |
| 2007/0281399 A1 | 12/2007 | Cites et al. | |
| 2007/0281440 A1 | 12/2007 | Cites et al. | |
| 2008/0038908 A1 | 2/2008 | Henley | |
| 2008/0061301 A1 | 3/2008 | Yamazaki | |
| 2008/0067529 A1 | 3/2008 | Yamazaki | |
| 2008/0067597 A1 | 3/2008 | Yamazaki | |
| 2008/0083953 A1 | 4/2008 | Yamazaki | |
| 2008/0224254 A1 | 9/2008 | Couillard et al. | |
| 2008/0246109 A1 | 10/2008 | Ohnuma et al. | |
| 2008/0280424 A1 | 11/2008 | Yamazaki et al. | |
| 2008/0283848 A1 | 11/2008 | Yamazaki | |
| 2008/0299744 A1 | 12/2008 | Yamazaki et al. | |
| 2008/0315350 A1 | 12/2008 | Tanaka | |
| 2008/0318367 A1 | 12/2008 | Shimomura et al. | |
| 2009/0004821 A1 | 1/2009 | Shimomura et al. | |
| 2009/0017598 A1 | 1/2009 | Shimomura et al. | |
| 2009/0081849 A1 | 3/2009 | Yamazaki et al. | |
| 2010/0267216 A1 | 10/2010 | Shimomura et al. | |
| 2010/0301415 A1 | 12/2010 | Tanaka | |
| 2011/0006314 A1 | 1/2011 | Yamazaki | |
| 2011/0300690 A1 | 12/2011 | Shimomura et al. | |

FOREIGN PATENT DOCUMENTS

| | | |
|---|---|---|
| JP | 10-135479 | 5/1998 |
| JP | 11-097379 A | 4/1999 |
| JP | 11-163363 A | 6/1999 |
| JP | 2000-012864 A | 1/2000 |
| JP | 2000-124092 A | 4/2000 |
| JP | 2000-294754 A | 10/2000 |
| JP | 2003-029667 A | 1/2003 |
| JP | 2003/324188 | 11/2003 |
| JP | 2004-134675 A | 4/2004 |
| JP | 2005-203596 A | 7/2005 |
| JP | 2005-252244 A | 9/2005 |
| WO | WO 01/11670 | 2/2001 |
| WO | WO 2005/029576 | 3/2005 |
| WO | WO-2006/062180 | 6/2006 |
| WO | WO 2007008897 A1 * | 1/2007 |

OTHER PUBLICATIONS

Written Opinion (Application No. PCT/JP2008/061499) Dated Sep. 30, 2008.

* cited by examiner

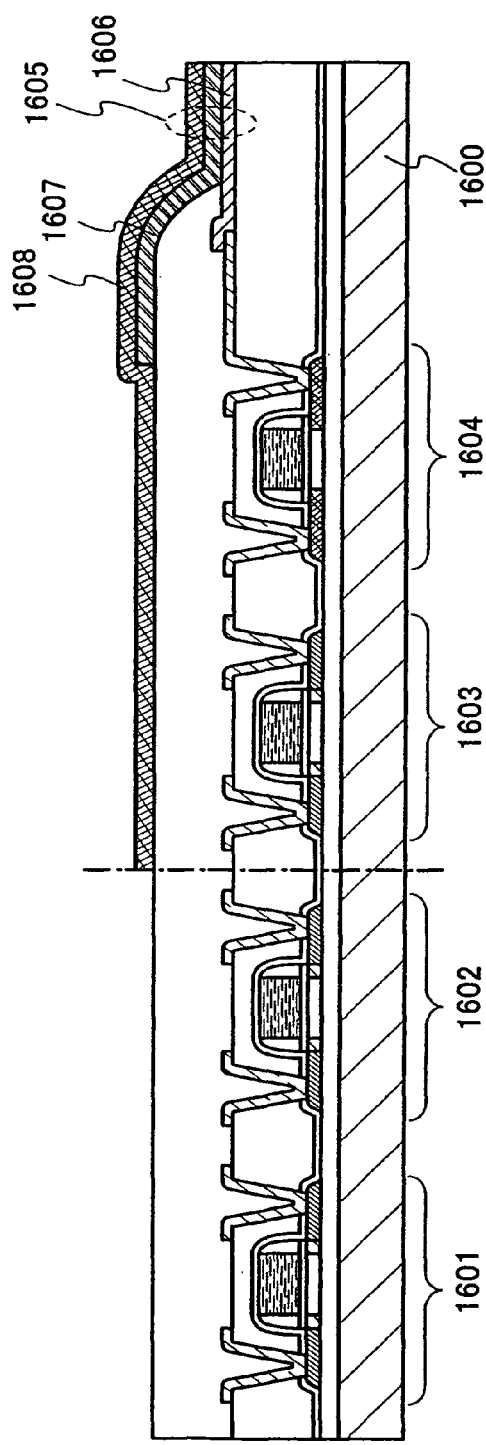
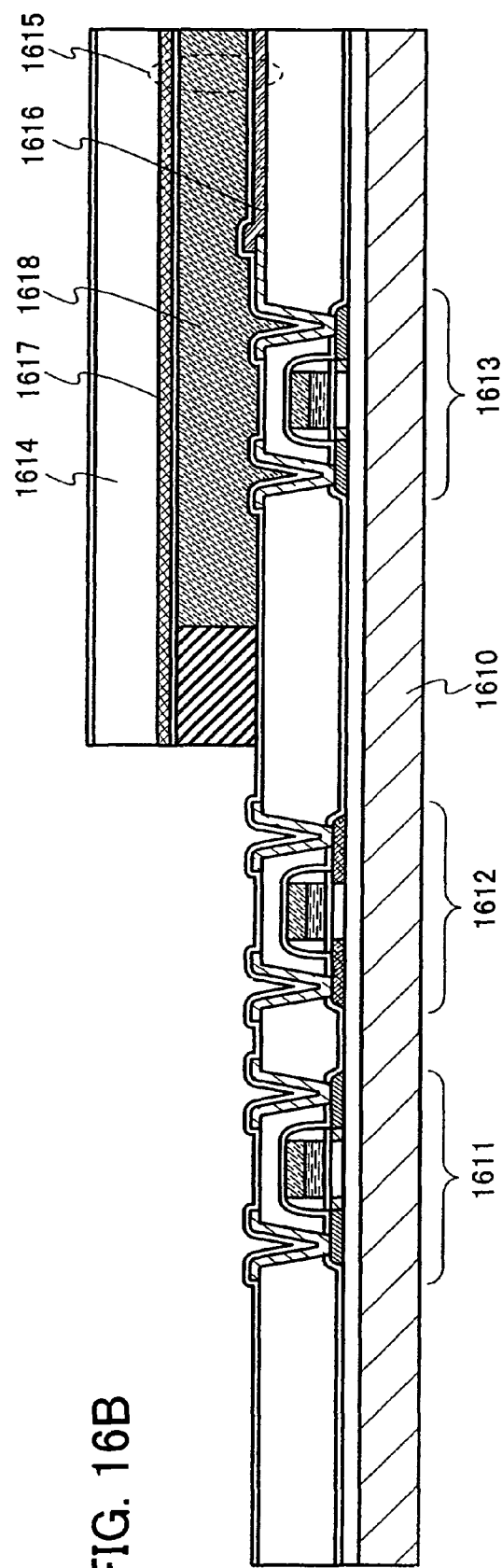
FIG. 16A
FIG. 16B

LAYER TRANSFER PROCESS FOR SEMICONDUCTOR DEVICE

TECHNICAL FIELD

The present invention relates to a manufacturing method of a semiconductor device using an SOI (silicon on insulator) substrate. In particular, the present invention relates to a bonding SOI technique, and a manufacturing method of a semiconductor device using an SOI substrate which is obtained in such a manner that a single crystal or polycrystalline semiconductor film is bonded to a substrate with an insulating film interposed therebetween.

BACKGROUND ART

Demands for higher integration, higher operation speed, higher performance, and lower power consumption have been more stringent, and in response to the demands, a transistor using an SOI substrate has attracted an attention as effective means that can take the place of a bulk transistor. Higher operation speed and lower power consumption can be expected more in the transistor using the SOI substrate than in the bulk transistor because an insulating film is formed over a semiconductor film in the transistor using the SOI substrate, and accordingly parasitic capacitance can be reduced and generation of leakage current flowing through the substrate can be suppressed. In addition, since the semiconductor film used as an active layer can be formed thin, a short channel effect can be suppressed; thus, an element can be miniaturized, and higher integration of a semiconductor integrated circuit can be realized accordingly. Moreover, since the transistor using the SOI substrate is completely latch-up free, there is no possibility that the element is broken due to heat caused by latch-up. Furthermore, the transistor using the SOI substrate does not need element isolation unlike the bulk transistor; thus, the transistor using the SOI substrate has advantages in that the distance between the elements can be shortened and higher integration can be realized.

As one of manufacturing methods of an SOI substrate, there is a method in which a semiconductor film is bonded to a substrate with an insulating film interposed therebetween, such as UNIBOND (registered trademark) typified by Smart Cut (registered trademark), ELTRAN (epitaxial layer transfer), a dielectric separation method, or a PACE (plasma assisted chemical etching) method. The above-described bonding methods make it possible to form a high-performance integrated circuit, in which a single crystal semiconductor film is used, over an inexpensive substrate.

As one example of the semiconductor device using the SOI substrate, one disclosed by the present applicants is known (Reference 1: Japanese Published Patent Application No. 2000-012864).

DISCLOSURE OF INVENTION

The size of a glass substrate used for manufacturing a semiconductor device such as a flat panel display or the like is increasing year by year, for example, the seventh generation (1900 mm×2200 mm) and the eighth generation (2160 mm×2460 mm). It is predicted that the glass substrate will have a larger area in the future, such as the ninth generation (2400 mm×2800 mm, 2450 mm×3050 mm) and the tenth generation (2950 mm×3400 mm). If the size of the glass substrate increases, more semiconductor devices can be produced from one glass substrate; accordingly, the production cost can be reduced.

On the other hand, typical sizes of the silicon substrate, which is one of semiconductor substrates, are 5 inches (125 mm), 6 inches (150 mm), 8 inches (200 mm), and 12 inches (300 mm) in diameter, and the size of the silicon substrate is remarkably small as compared to that of the glass substrate. Therefore, in the case of transferring a semiconductor film from a semiconductor substrate to a large-sized glass substrate, transfer needs to be carried out at a plurality of places. However, there are a case in which the semiconductor substrate is warped or deformed and a case in which an end portion of the semiconductor substrate is rounded slightly. Further, there is also a case in which hydrogen ions cannot be added into an end portion sufficiently in adding the hydrogen ions in order to separate a semiconductor film from a semiconductor substrate. Accordingly, it is difficult to transfer the end portion of the semiconductor film to a glass substrate. There has been such a problem that if the transfer is carried out at a plurality of places so that semiconductor substrates are not overlapped with each other, the distance between the transferred semiconductor films becomes larger, and it becomes difficult to manufacture one semiconductor device for which the semiconductor films are used without the influence of the space between the semiconductor films.

In view of the above-mentioned problem, it is an object of the present invention to make the distance between semiconductor films which are transferred to a plurality of places small.

In the present invention, transfer of a semiconductor film from a semiconductor substrate (bond substrate) to a supporting substrate (base substrate) is carried out a plurality of times. In the case where a semiconductor film transferred first and a semiconductor film transferred later are provided adjacently, the latter transfer is carried out using a bond substrate with its end portion partially removed. The width in a perpendicular direction (depth direction) to the bond substrate used for the later transfer, of the region of the bond substrate 100b corresponding to the removed end portion is larger than the thickness of the semiconductor film which is transferred first. A bond substrate with its end portion partially removed may be used for not only the later transfer but also the first transfer. Note that the width in a perpendicular direction (depth direction) to the bond substrate used for the first transfer, of the region of the bond substrate corresponding to the removed end portion is equal to or larger than the thickness of the semiconductor film to be transferred first.

Specifically, the above-mentioned transfers are carried out in the following manner. After a first bond substrate is bonded to a base substrate, the first bond substrate is divided, and a first semiconductor film which is part of the first bond substrate is transferred so as to remain over the base substrate. Next, a second bond substrate in which a projection is formed by partially removing an end portion is bonded to the base substrate. The second bond substrate is bonded to the base substrate so that the projection faces the base substrate side. The width in a perpendicular direction to the second bond substrate, of a region of the second bond substrate, which is included in the projection is larger than the thickness of the first semiconductor film. Further, the second bond substrate is bonded to the base substrate so that a region of the second bond substrate other than the projection partially overlaps with the first semiconductor film which has been transferred first. Then, the second bond substrate is separated, and a second semiconductor film which is part of the projection of the second bond substrate is transferred so as to remain over the base substrate. The second semiconductor film is transferred to a region other than the region to which the first semiconductor film has been transferred.

By using the bond substrate with its end portion partially removed, the later transfer of the semiconductor film can be carried out so that the semiconductor film transferred later is not in contact with the semiconductor film which has been transferred first and so that the bond substrate partially overlaps with the semiconductor film which has been transferred first. Therefore, the distance between the semiconductor film transferred first and the semiconductor film transferred later can be made small; accordingly, the transferred semiconductor films can be used for one semiconductor device without the influence of the space between the semiconductor films.

BRIEF DESCRIPTION OF THE DRAWINGS

In the accompanying drawings:

FIGS. 16A and 16B are cross-sectional views of pixels of semiconductor display devices manufactured using the present invention;

BEST MODE FOR CARRYING OUT THE INVENTION

Embodiment modes of the present invention will be hereinafter described with reference to the drawings. However, the present invention can be carried out in many different modes and it will be readily appreciated by those skilled in the art that modes and details of the present invention can be modified in various ways without departing from the purpose and scope of the present invention. Therefore, the present invention should not be interpreted as being limited to the following description of embodiment modes.

Embodiment Mode 1

In Embodiment Mode 1, a manufacturing method of a semiconductor device according to the present invention will be described, in which transfer of a semiconductor film from a bond substrate to a base substrate is carried out a plurality of times.

Figure 1A:
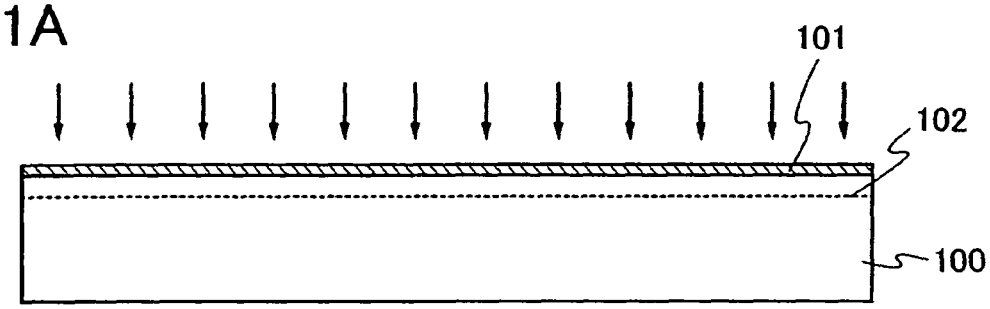
FIGS. 1A to 1C are cross-sectional views illustrating a manufacturing method of a semiconductor device according to the present invention.

First, as illustrated in FIG. 1A, an insulating film 101 is formed on a bond substrate 100. As the bond substrate 100, a single crystal semiconductor substrate or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 100. In addition, as the bond substrate 100, a semiconductor substrate formed of silicon having crystal lattice distortion, silicon germanium in which germanium is added to silicon, or the like may also be used. Silicon having lattice distortion can be formed by formation of silicon on silicon germanium or silicon nitride which has larger lattice constant than silicon.

The insulating film 101 is formed using an insulating material such as silicon oxide, silicon nitride oxide, silicon oxynitride, or silicon nitride. The insulating film 101 may be either a single insulating film or stacked layers of a plurality of insulating films. For example, in this embodiment mode, the insulating film 101 is used in which silicon oxynitride containing a larger amount of oxygen than nitrogen and silicon nitride oxide containing a larger amount of nitrogen than oxygen are stacked in this order from the side near the bond substrate 100.

For example, in the case of using silicon oxide for the insulating film 101, the insulating film 101 can be formed using a mixed gas of silane and oxygen, a mixed gas of TEOS (tetraethoxysilane) and oxygen, or the like by a vapor deposition method such as a thermal CVD method, a plasma CVD method, an atmospheric pressure CVD method, or a bias ECRCVD method. In this case, a surface of the insulating film 101 may be densified by oxygen plasma treatment. In the case of using silicon nitride for the insulating film 101, the insulating film 101 can be formed using a mixed gas of silane and ammonia by a vapor deposition method such as a plasma CVD method. In the case of using silicon nitride oxide for the insulating film 101, the insulating film 101 can be formed using a mixed gas of silane and ammonia or a mixed gas of silane and nitrogen oxide by a vapor deposition method such as a plasma CVD method.

Alternatively, the insulating film 101 may be formed using silicon oxide which is formed with the use of an organic silane gas by a chemical vapor deposition method. As the organic silane gas, the following may be used: a silicon-containing compound such as ethyl silicate (TEOS: $Si(OC_2H_5)_4$), tetramethylsilane (TMS: $Si(CH_3)_4$), tetramethylcyclotetrasiloxane (MCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

Next, as illustrated in FIG. 1A, hydrogen or a rare gas, or hydrogen ions or rare gas ions is introduced into the bond substrate 100 as indicated by arrows, whereby a fragile layer 102 having microvoids is formed in a region at a certain depth from a surface of the bond substrate 100. The position where the fragile layer 102 is formed is determined depending on acceleration voltage at the time of the above-described introduction. The thickness of a semiconductor film which is transferred from the bond substrate 100 to a base substrate 104 is determined by the position of the fragile layer 102; therefore, the acceleration voltage at the time of the introduction is determined in consideration of the thickness of the semiconductor film. Further, the position of the fragile layer 102 depends on not only the acceleration voltage at the time of the introduction but also the thickness of the insulating film 101. For example, when the thickness of the insulating film 101 is made larger, the thickness of the semiconductor film can be made smaller. The semiconductor film is formed to a thickness of, for example, 10 nm to 200 nm, and preferably 10 nm to 50 nm. For example, in the case where hydrogen is introduced into the bond substrate 100, the dose is desirably $1\times10^{16}/cm^2$ to $1\times10^{17}/cm^2$. In this embodiment mode, introduction of hydrogen or hydrogen ions is performed under the condition in which the dose is $1.75\times10^{16}/cm^2$ and the acceleration voltage is 40 kV.

Note that since hydrogen or a rare gas, or hydrogen ions or rare gas ions is introduced into the bond substrate 100 at high concentration in the step of forming the fragile layer 102, the surface of the bond substrate 100 becomes rough and sufficient strength for bonding with the base substrate 104 cannot be obtained in some cases. By provision of the insulating film 101, the surface of the bond substrate 100 is protected at the time of the introduction of hydrogen or a rare gas, or hydrogen ions or rare gas ions, and the base substrate 104 and the bond substrate 100 can be favorably bonded to each other.

Figure 1B:
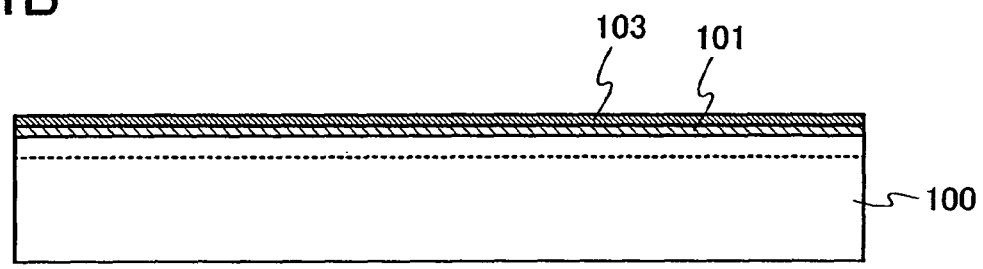

As illustrated in FIG. 1B, an insulating film 103 is formed over the insulating film 101. The insulating film 103 is formed using an insulating material such as silicon oxide, silicon nitride oxide, silicon oxynitride, or silicon nitride, similarly to the insulating film 101. The insulating film 103 may be formed using a single insulating film or a stack of a plurality of insulating films. As the insulating film 103, silicon oxide may be formed using an organic silane gas by a chemical vapor deposition method. In this embodiment mode, silicon oxide formed using an organic silane gas by a chemical vapor deposition method is used for the insulating film 103.

An insulating film having an excellent barrier property such as silicon nitride or silicon nitride oxide is used for the insulating film 101 or the insulating film 103, whereby impurities such as an alkali metal or an alkaline-earth metal can be prevented from entering a semiconductor film 106a and a semiconductor film 106b which are to be transferred to the base substrate 104, from the base substrate 104.

Although the insulating film 103 is formed after the fragile layer 102 is formed in this embodiment mode, the insulating film 103 is not necessarily required. However, the insulating film 103 is formed after the fragile layer 102 is formed; therefore, a surface of the insulating film 103 has planarity higher than the insulating film 101 which is formed before the formation of the fragile layer 102. Accordingly, strength of bonding which is performed later can be increased by the formation of the insulating film 103.

Figure 1C:
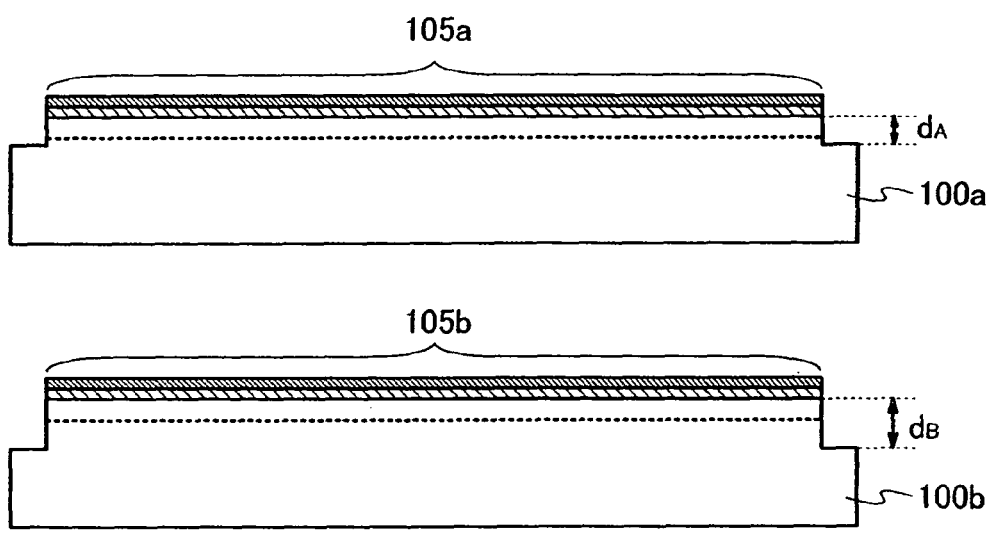

Next, an end portion of the bond substrate 100 is partially removed. In this embodiment mode, as illustrated in FIG. 1C, the end portion of the bond substrate 100 is partially removed together with an end portion of the insulating film 101 and an end portion of the insulating film 103, so that a bond substrate 100a having a projection 105a and a bond substrate 100b having a projection 105b are formed.

The bond substrate 100a is used for the first transfer. The width $d_A$ in a perpendicular direction (depth direction) to the bond substrate 100a, of the region of the bond substrate 100a corresponding to the removed end portion is equal to or larger than the thickness of the semiconductor film 106a which is transferred from the bond substrate 100a. In addition, the bond substrate 100b is used for the later transfer. The width $d_B$ in a perpendicular direction (depth direction) to the bond substrate 100b, of the region of the bond substrate 100b corresponding to the removed end portion is larger than the thickness of the semiconductor film 106a which is transferred first.

Specifically, the width $d_A$ in the depth direction of the region corresponding to the removed end portion, that is, the width $d_A$ in the perpendicular direction to the bond substrate 100a, of a region of the bond substrate 100a, which is included in the projection 105a is set at, for example, 10 nm or larger, and preferably 200 nm or larger in consideration of the thickness of the semiconductor film 106a. In addition, the width $d_B$ in the depth direction of the region corresponding to the removed end portion, that is, the width $d_B$ in the perpendicular direction to the bond substrate 100b, of a region of the bond substrate 100b, which is included in the projection 105b is set at, for example, several μm or larger, and preferably 10 μm or larger in consideration of the thickness of the semiconductor film 106a.

Each of the widths in a parallel direction to the bond substrate 100a and the bond substrate 100b, of the regions corresponding to the removed end portions may be several mm to several tens of mm, for example.

In this embodiment mode, an end portion of not only the bond substrate 100b used for the later transfer but also the bond substrate 100a used for the first transfer is partially removed; however, the present invention is not limited to this structure. The present invention is acceptable as long as a bond substrate with its end portion partially removed is used in at least the transfer which is carried out later among a plurality of transfers. Note that it is difficult to transfer a portion of a semiconductor film, which is located at an end portion of a bond substrate, to a base substrate. Therefore, the reproducibility of the shape of the transferred semiconductor film becomes higher in the case where an end portion is partially removed in the bond substrate 100a used for the first transfer than in the case where the end portion is not partially removed. Thus, positional alignment of the bond substrate 100b which is bonded later can be made easier, and the distance between the semiconductor films can be made small.

Further, the width $d_A$ is smaller than the width $d_B$ in this embodiment mode; however, the present invention is not limited to this structure. The width $d_A$ may be equal to the width $d_B$ or may be larger than the width $d_B$.

Before the bond substrate 100a and the bond substrate 100b are bonded to the base substrate 104, the bond substrate 100a and the bond substrate 100b may be hydrogenated. The hydrogenation is performed, for example, at 350° C. in a hydrogen atmosphere for approximately two hours.

Figure 2A:
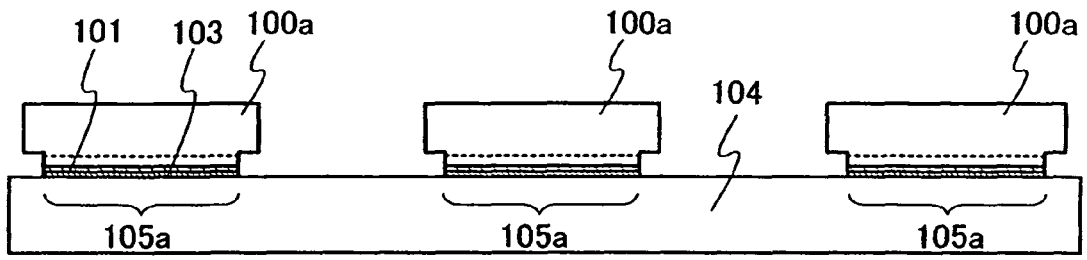
FIGS. 2A to 2D are cross-sectional views illustrating a manufacturing method of a semiconductor device according to the present invention.

As illustrated in FIG. 2A, the bond substrate 100a is bonded to the base substrate 104 so that the projection 105a faces the base substrate 104 side, that is, the insulating film 101 and the insulating film 103 are interposed between the bond substrate 100a and the base substrate 104. The insulating film 103 and the base substrate 104 are bonded to each other at the projection 105a, whereby the bond substrate 100a and the base substrate 104 can be bonded together.

The bonding is performed by van der Waals forces, so that strong bonding can be formed even at room temperature. Note that since the above-described bonding can be performed at a low temperature, various substrates can be used for the base substrate 104. As the base substrate 104, for example, a substrate such as a quartz substrate or a sapphire substrate can be used as well as a glass substrate made of aluminosilicate glass, barium borosilicate glass, aluminoborosilicate glass, or the like. Furthermore, as the base substrate 104, a semiconductor substrate formed of silicon, gallium arsenide, indium phosphide, or the like can be used. Alternatively, a metal substrate including a stainless-steel substrate can be used as the base substrate 104.

Heat treatment or pressure treatment may be performed after the base substrate 104 and the bond substrate 100a are bonded to each other. The bonding strength can be increased with heat treatment or pressure treatment.

Figure 2B:
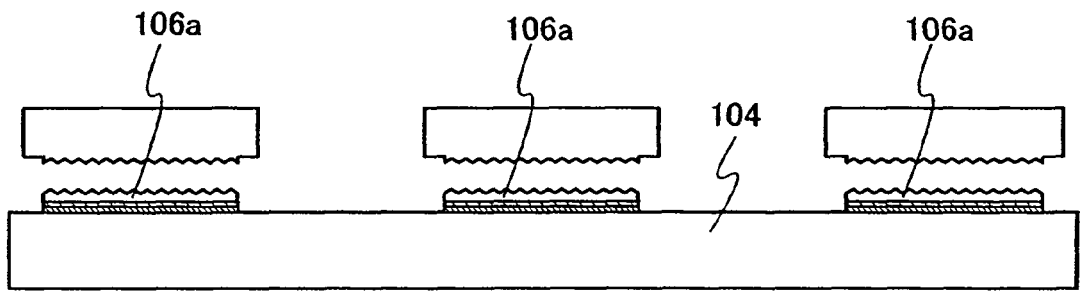

Heat treatment is performed after the bond substrate 100a and the base substrate 104 are bonded to each other, and thereby the adjacent microvoids in the fragile layer 102 are coupled, and the volume of the microvoid is increased. As a result, as illustrated in FIG. 2B, the bond substrate 100a is split or divided along the fragile layer 102; thus, the semiconductor film 106a which has been part of the bond substrate 100a is separated from the bond substrate 100a. The heat treatment is preferably performed at a temperature that is equal to or lower than the allowable temperature limit of the base substrate 104. For example, heat treatment may be performed at a temperature ranging from 400° C. to 600° C. By this separation, the semiconductor film 106a is transferred to the base substrate 104, together with the insulating film 101 and the insulating film 103. After that, heat treatment at a temperature ranging from 400° C. to 600° C. is preferably performed in order to make the attachment between the insulating film 103 and the base substrate 104 stronger.

Figure 2C:
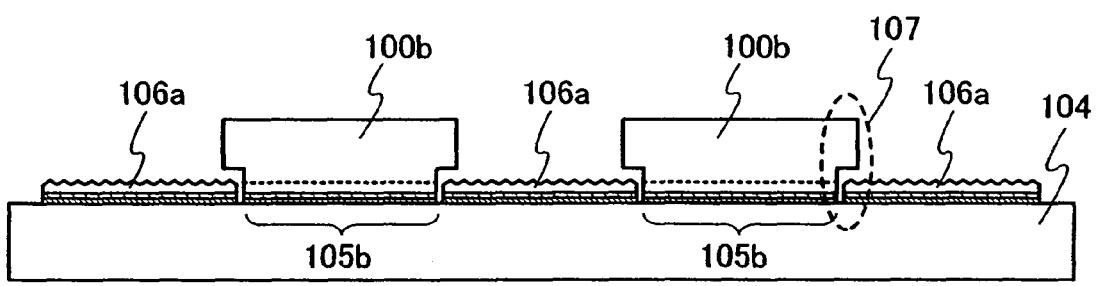

Next, as illustrated in FIG. 2C, the bond substrate 100b is bonded to the base substrate 104 so that the projection 105b faces the base substrate 104 side, that is, the insulating film 101 and the insulating film 103 are interposed between the bond substrate 100b and the base substrate 104. The insulating film 103 and the base substrate 104 are bonded to each other at the projection 105b, whereby the bond substrate 100b and the base substrate 104 can be bonded together.

Note that the bonding of the bond substrate 100b is carried out in such a manner that the projection 105b is disposed in a region other than the region including the semiconductor film 106a which has been transferred first. As is realized by focusing on the portion surrounded by a broken line 107, since the end portion of the bond substrate 100b is partially removed in the present invention, the projection 105b can be disposed close to the semiconductor film 106a without causing contact between the bond substrate 100b and the semiconductor film 106a, to such an extent that the bond substrate 100b and the semiconductor film 106a are partially overlapped with each other.

The bonding is performed by van der Waals forces similarly to the first transfer, so that strong bonding can be formed even at room temperature. Heat treatment or pressure treatment may be performed after the base substrate 104 and the bond substrate 100b are bonded to each other. The bonding strength can be increased with heat treatment or pressure treatment.

Figure 2D:
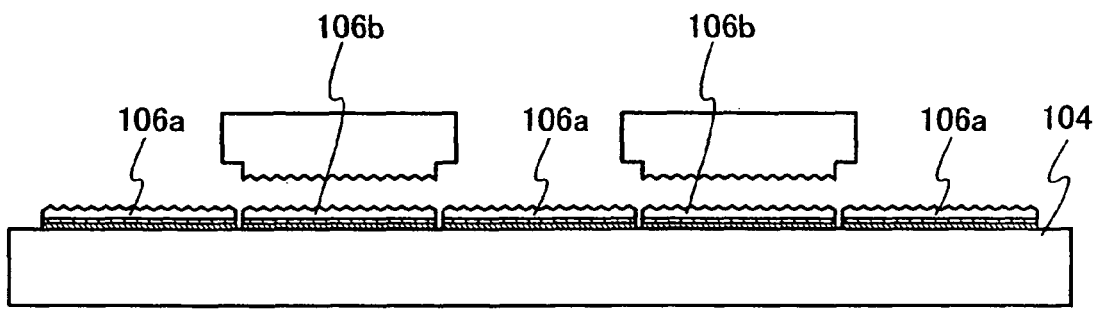

Heat treatment is performed after the bond substrate 100b and the base substrate 104 are bonded to each other, and thereby the adjacent microvoids in the fragile layer 102 are coupled, and the volume of the microvoid is increased. As a result, as illustrated in FIG. 2D, the bond substrate 100b is split or divided along the fragile layer 102; thus, the semiconductor film 106b which has been part of the bond substrate 100b is separated from the bond substrate 100b. The heat treatment is preferably performed at a temperature that is equal to or lower than the allowable temperature limit of the base substrate 104. For example, heat treatment may be performed at a temperature ranging from 400° C. to 600° C. By this separation, the semiconductor film 106b is transferred to the base substrate 104, together with the insulating film 101 and the insulating film 103. After that, heat treatment at a temperature ranging from 400° C. to 600° C. is preferably performed in order to make the attachment between the insulating film 103 and the base substrate 104 stronger.

Crystal plane orientation of the semiconductor film 106a and the semiconductor film 106b can be controlled by the plane orientation of the bond substrate 100a and the bond substrate 100b, respectively. The bond substrate 100a and the bond substrate 100b each having crystal plane orientation which is suitable for a semiconductor element to be formed may be selected as appropriate. The mobility of the transistors depends on the crystal plane orientation of the semiconductor film 106a and the semiconductor film 106b. In order to obtain transistors with higher mobility, the direction of bonding the bond substrate 100a and the bond substrate 100b is set in consideration of the direction of channels and the crystal plane orientation.

An insulating film may be formed on a surface of the base substrate 104. In this case, the base substrate 104 is bonded to the bond substrate 100a and the bond substrate 100b by attachment of the insulating film 103 and the insulating film formed on the surface of the base substrate 104. Formation of the insulating film on the surface of the base substrate 104 can prevent impurities such as an alkali metal or an alkaline-earth metal from entering the semiconductor film 106a and the semiconductor film 106b from the base substrate 104.

Figure 3A:
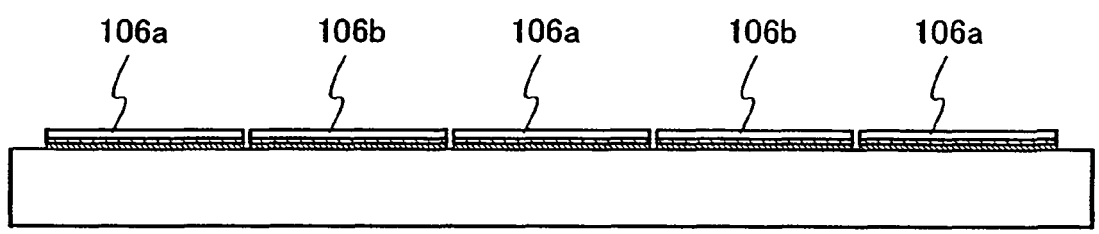
FIGS. 3A and 3B are cross-sectional views illustrating a manufacturing method of a semiconductor device according to the present invention.

Next, as illustrated in FIG. 3A, a surface of the transferred semiconductor film 106a and a surface of the transferred semiconductor film 106b are planarized. Although the planarization is not necessarily essential, the planarization makes it possible to improve characteristics of the interface between a gate insulating film, and the semiconductor film 106a and the semiconductor film 106b in the transistors to be formed later. Specifically, the planarization can be performed by chemical mechanical polishing (CMP), liquid jet polishing, or the like. The thickness of the semiconductor film 106a and the semiconductor film 106b is reduced by the above-described planarization.

Although this embodiment mode describes the case where a Smart Cut (registered trademark) method is used in which the semiconductor film 106a and the semiconductor film 106b are separated from the bond substrate 100a and the bond substrate 100b, respectively, using the fragile layer 102, another bonding method such as ELTRAN (epitaxial layer transfer), a dielectric isolation method, or a PACE (plasma assisted chemical etching) method may be used.

Figure 3B:

Next, as illustrated in FIG. 3B, the planarized semiconductor film 106a and the planarized semiconductor film 106b are processed (patterned) into desired shapes, so that island-shaped semiconductor films 108 are formed. Note that, element isolation may be performed by a selective oxidation method (LOCOS: local oxidation of silicon), a shallow trench isolation (STI) method, or the like instead of patterning of the semiconductor films.

Using the island-shaped semiconductor films 108 formed through the above-described process, various kinds of semiconductor elements such as a transistor can be formed in the present invention.

In the present invention, by using the bond substrate 100b with its end portion partially removed, the later transfer of the semiconductor film 106b can be carried out so that the semiconductor film 106b is not in contact with the semiconductor film 106a which has been transferred first and so that the semiconductor film 106b partially overlaps with the semiconductor film 106a which has been transferred first. Therefore, the distance between the semiconductor film 106a transferred first and the semiconductor film 106b transferred later can be as small as several tens of micrometers; accordingly, the transferred semiconductor film 106a and the transferred semiconductor film 106b can be used for one semiconductor device without the influence of the space between the semiconductor films.

The present invention can be applied to manufacture all kinds of semiconductor devices such as microprocessors, integrated circuits such as image processing circuits, RF tags which can send and receive data to/from an interrogator wirelessly, and semiconductor display devices. The semiconductor display devices include the following in its category: liquid crystal display devices, light-emitting devices in which a light-emitting element typified by an organic light-emitting element (OLED) is provided for each pixel, DMDs (digital micromirror devices), PDPs (plasma display panels), FEDs (field emission displays), and other semiconductor display devices in which a circuit element using a semiconductor film is included in a driver circuit.

Embodiment Mode 2

In Embodiment Mode 2, the layout of semiconductor films which are transferred to a base substrate will be described.

Figure 4A:
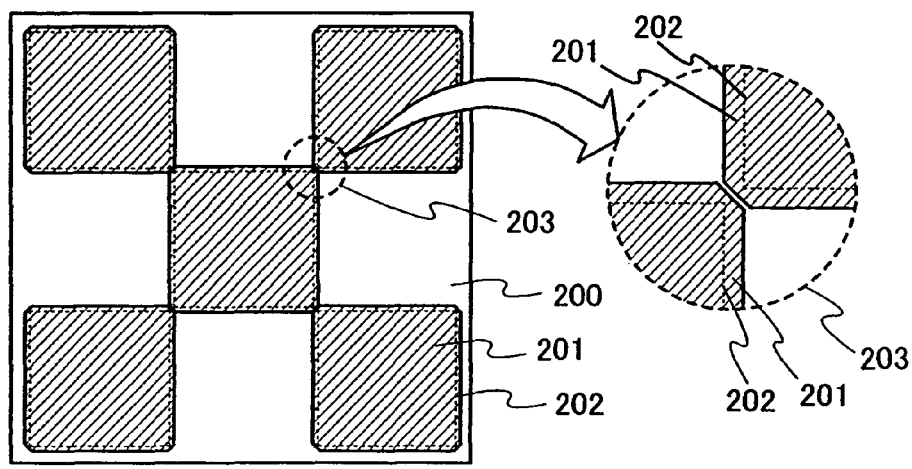
FIGS. 4A to 4C are top views illustrating a manufacturing method of a semiconductor device according to the present invention.

FIG. 4A is a top view of a base substrate 200 to which a plurality of bond substrates 201 are bonded. The plurality of bond substrates 201 are disposed in different regions so as not to overlap with each other. Each of the plurality of bond substrates 201 has a projection 202 shown by a broken line and is bonded to the base substrate 200 so that the projection 202 faces the base substrate 200 side.

Although FIG. 4A illustrates the bond substrates 201 having a shape of a rectangle with its four corners cut out, the present invention is not limited to this structure. The bond substrates 201 may have a rectangular shape or a shape of a rectangle with four rounded corners. Note that when the bond substrates 201 have not the rectangular shape but the shape of a rectangle with its four corners cut out or the shape of a rectangle with four rounded corners, as understood by an enlarged view of a portion surrounded by a broken line 203, the distance between the projections 202 included in the bond substrates 201 which are adjacent at their corners can be shortened. Accordingly, the distance between semiconductor films which are transferred from the adjacent bond substrates 201 can be made small.

When the bond substrate 201 has an orientation flat or a flat which indicates the plane orientation or the substrate direction, the projection 202 is desirably formed so as not to overlap with the orientation flat or the flat.

Figure 4B:
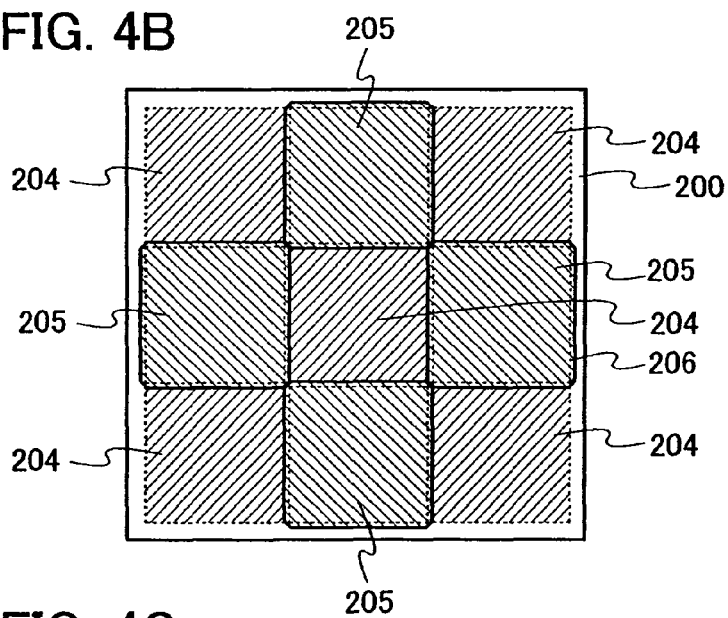

The bond substrates 201 are bonded to the base substrate 200 as illustrated in FIG. 4A and then divided, so that semiconductor films 204 are transferred to the base substrate 200 as illustrated in FIG. 4B. Next, a plurality of bond substrates 205 are bonded to the base substrate 200.

Similarly to the bond substrates 201, the plurality of bond substrates 205 are disposed in different regions so as not to overlap with each other. In addition, each of the plurality of bond substrates 205 has a projection 206 shown by a broken line and is bonded to the base substrate 200 so that the projection 206 faces the base substrate 200 side. The bond substrates 205 may partially overlap with the semiconductor films 204, but each of the projections 206 included in the bond substrates 205 is disposed in a region different from the regions to which the semiconductor films 204 have been transferred.

Although FIG. 4B illustrates the bond substrates 205 having a shape of a rectangle with its four corners cut out similarly to the bond substrates 201, the present invention is not limited to this structure. The bond substrates 205 may have a rectangular shape or a shape of a rectangle with four rounded corners. Note that when the bond substrates 205 have not the rectangular shape but the shape of a rectangle with its four corners cut out or the shape of a rectangle with four rounded corners, the distance between the projections 206 included in the bond substrates 205 which are adjacent at their corners can be shortened. Accordingly, the distance between semiconductor films which are transferred from the adjacent bond substrates 205 can be made small.

When the bond substrate 205 has an orientation flat or a flat which indicates the plane orientation or the substrate direction, the projection 206 is desirably formed so as not to overlap with the orientation flat or the flat.

Figure 4C:
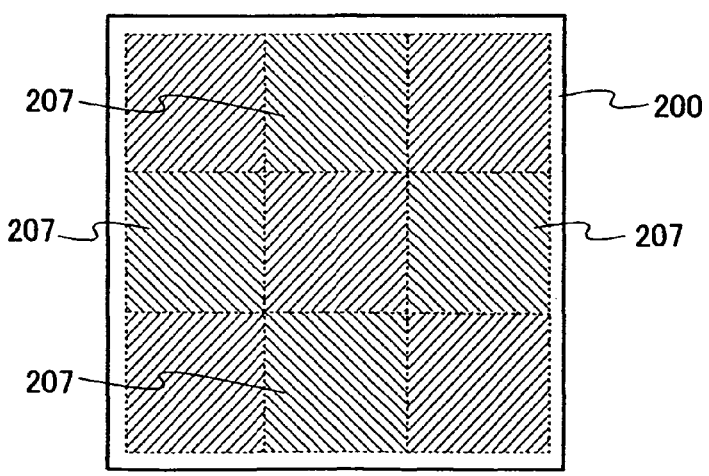

The bond substrates 205 are bonded to the base substrate 200 as illustrated in FIG. 4B and then divided, so that semiconductor films 207 are transferred to the base substrate 200 as illustrated in FIG. 4C.

In the present invention, by using the bond substrates 205 with its end portion partially removed, the later transfer of the semiconductor films 207 can be carried out so that the semiconductor films 207 are not in contact with the semiconductor films 204 which have been transferred first and so that the semiconductor films 204 transferred first and the bond substrates 205 partially overlap with each other. Therefore, the distance between the semiconductor film 204 transferred first and the semiconductor film 207 transferred later can be as small as several tens of micrometers; accordingly, the transferred semiconductor film 204 and the transferred semiconductor film 207 can be used for one semiconductor device without the influence of the space between the semiconductor films.

In this embodiment mode, an end portion of not only the bond substrates 205 used for the later transfer but also the bond substrates 201 used for the first transfer is partially removed; however, the present invention is not limited to this structure. The present invention is acceptable as long as a bond substrate with its end portion partially removed is used in at least the transfer which is carried out later among transfers which are carried out a plurality of times. Note that it is difficult to transfer a portion of a semiconductor film, which is located at an end portion of a bond substrate, to a base substrate with high reproducibility. Therefore, the semiconductor films 204 can be transferred with high reproducibility in the case where end portions are partially removed in the bond substrates 201 used for the first transfer than in the case where the end portions are not partially removed. Thus, positional alignment of the bond substrates 205 which are bonded later can be made easier, and the distance between the semiconductor films 204 and the semiconductor films 207 can be made small.

This embodiment mode can be implemented in combination with the above embodiment mode as appropriate.

Embodiment Mode 3

In Embodiment Mode 3, the layout of semiconductor films which are transferred to a base substrate will be described.

Figure 5A:
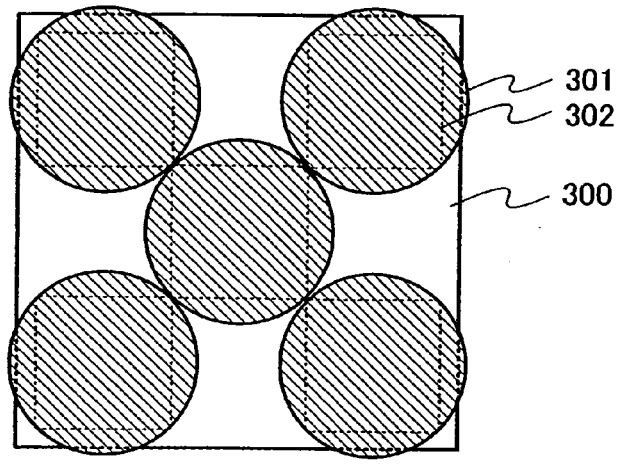
FIGS. 5A to 5C are top views illustrating a manufacturing method of a semiconductor device according to the present invention.

FIG. 5A is a top view of a base substrate 300 to which a plurality of bond substrates 301 each having a circular shape are bonded. The plurality of bond substrates 301 are disposed in different regions so as not to overlap with each other. Each of the plurality of bond substrates 301 has a projection 302 shown by a broken line and is bonded to the base substrate 300 so that the projection 302 faces the base substrate 300 side.

Although FIG. 5A illustrates the projections 302 having a shape of a rectangle with its four corners cut out, the present invention is not limited to this structure. The projections 302 may have a rectangular shape or a shape of a rectangle with four rounded corners. Note that when the projections 302 have not the rectangular shape but the shape of a rectangle with its four corners cut out or the shape of a rectangle with four rounded corners, positional alignment of semiconductor films which are transferred from the projections 302, at each corner can be made easier.

When the bond substrate 301 has a notch or a flat which indicates the plane orientation, the projection 302 is desirably formed so as not to overlap with the notch or the flat.

Figure 5B:
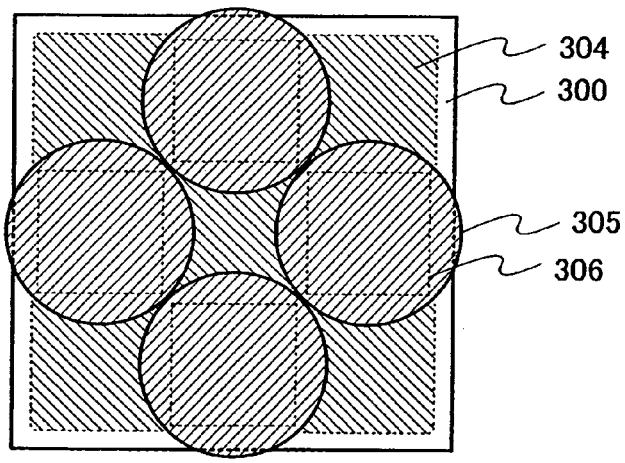

The bond substrates 301 are bonded to the base substrate 300 as illustrated in FIG. 5A and then divided at the projections 302, so that semiconductor films 304 are transferred to the base substrate 300 as illustrated in FIG. 5B. Next, a plurality of bond substrates 305 are bonded to the base substrate 300.

Similarly to the bond substrates 301, the plurality of bond substrates 305 are disposed in different regions so as not to overlap with each other. In addition, each of the plurality of bond substrates 305 has a projection 306 shown by a broken line and is bonded to the base substrate 300 so that the projection 306 faces the base substrate 300 side. The bond substrates 305 may partially overlap with the semiconductor films 304, but each of the projections 306 included in the bond substrates 305 is disposed in a region different from the regions to which the semiconductor films 304 have been transferred.

Although the projections 306 of the bond substrates 305 have a rectangular shape in FIG. 5B, the present invention is not limited to this structure. The projections 306 of the bond substrates 305 may have a shape of a rectangle with its four corners cut out, or a shape of a rectangle with four rounded corners.

Figure 5C:
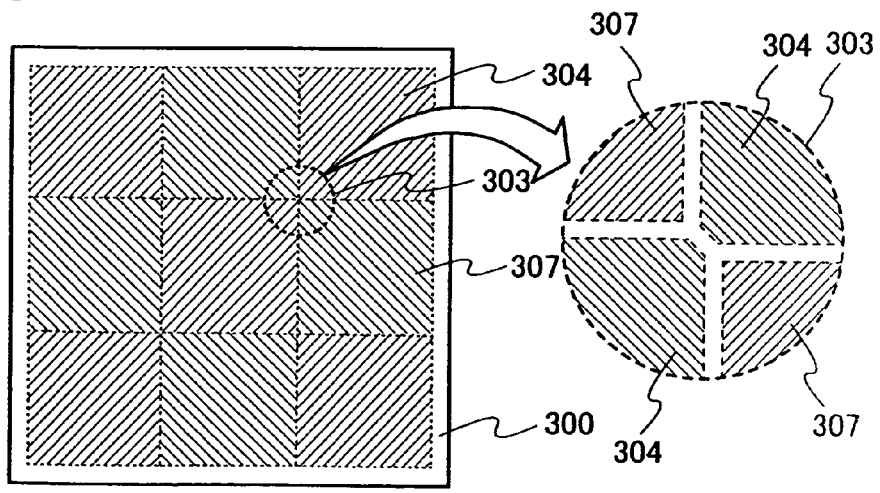

The bond substrates 305 are bonded to the base substrate 300 as illustrated in FIG. 5B and then divided at the projections 306, so that semiconductor films 307 can be transferred to the base substrate 300 as illustrated in FIG. 5C.

As is understood by an enlarged view of a portion surrounded by a broken line 303, the semiconductor films 304 which are adjacent to each other at their corners have a shape of a rectangle with its four corners cut out, similarly to the projections 302. Therefore, positional alignment of the semiconductor films 304 at corners can be made easier at the time of transfer.

When the bond substrate 305 has a notch or a flat which indicates the plane orientation, the projection 306 is desirably formed so as not to overlap with the notch or the flat.

In the present invention, by using the bond substrates 305 with its end portion partially removed, the later transfer of the semiconductor films 307 can be carried out so that the semiconductor films 307 are not in contact with the semiconductor films 304 which have been transferred first and so that the semiconductor films 304 transferred first and the bond substrates 305 partially overlap with each other. Therefore, the distance between the semiconductor film 304 transferred first and the semiconductor film 307 transferred later can be as small as several tens of micrometers; accordingly, the transferred semiconductor film 304 and the transferred semiconductor film 307 can be used for one semiconductor device without the influence of the space between the semiconductor films.

In this embodiment mode, an end portion of not only the bond substrates 305 used for the later transfer but also the bond substrates 301 used for the first transfer is partially removed; however, the present invention is not limited to this structure. The present invention is acceptable as long as a bond substrate with its end portion partially removed is used in at least the transfer which is carried out later among a plurality of transfers. Note that it is difficult to transfer a portion of a semiconductor film located in an end portion of a bond substrate to a base substrate with high reproducibility. Therefore, the semiconductor films 304 can be transferred with high reproducibility in the case where end portions are partially removed in the bond substrates 301 used for the first transfer than in the case where the end portions are not partially removed. Thus, positional alignment of the bond substrates 305 which are bonded later can be made easier, and the distance between the semiconductor films 304 and the semiconductor films 307 can be made small.

This embodiment mode can be implemented in combination with any of the above embodiment modes as appropriate.

Embodiment Mode 4

In Embodiment Mode 4, the layout of semiconductor films which are transferred to a base substrate will be described.

Figure 6A:
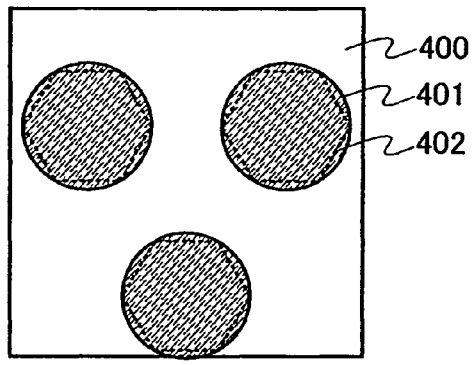
FIGS. 6A to 6D are top views illustrating a manufacturing method of a semiconductor device according to the present invention.

FIG. 6A is a top view of a base substrate 400 to which a plurality of bond substrates 401 each having a circular shape are bonded. The plurality of bond substrates 401 are disposed in different regions so as not to overlap with each other. Each of the plurality of bond substrates 401 has a projection 402 shown by a broken line and is bonded to the base substrate 400 so that the projection 402 faces the base substrate 400 side.

When the bond substrate 401 has a notch or a flat which indicates the plane orientation, the projection 402 is desirably formed so as not to overlap with the notch or the flat.

Figure 6B:
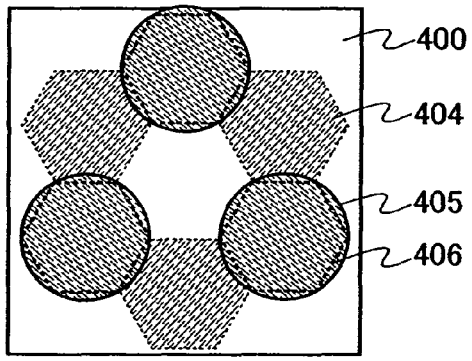

The bond substrates 401 are bonded to the base substrate 400 as illustrated in FIG. 6A and then divided at the projections 402, so that semiconductor films 404 are transferred to the base substrate 400 as illustrated in FIG. 6B. Next, a plurality of bond substrates 405 are bonded to the base substrate 400.

Similarly to the bond substrates 401, the plurality of bond substrates 405 are disposed in different regions so as not to overlap with each other. In addition, each of the plurality of bond substrates 405 has a projection 406 shown by a broken line and is bonded to the base substrate 400 so that the projection 406 faces the base substrate 400 side. The bond substrates 405 may partially overlap with the semiconductor films 404, but each of the projections 406 included in the bond substrates 405 is disposed in a region different from the regions to which the semiconductor films 404 have been transferred. Note that a case where the projections 406 are regular hexagonal is described as an example in this embodiment mode.

When the bond substrate 405 has a notch or a flat which indicates the plane orientation, the projection 406 is desirably formed so as not to overlap with the notch or the flat.

Figure 6C:
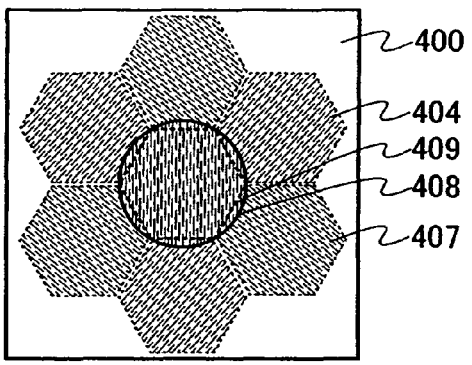

The bond substrates 405 are bonded to the base substrate 400 as illustrated in FIG. 6B and then divided at the projections 406, so that semiconductor films 407 can be transferred to the base substrate 400 as illustrated in FIG. 6C. Next, a bond substrate 408 is bonded to the base substrate 400.

The bond substrate 408 has a projection 409 shown by a broken line and is bonded to the base substrate 400 so that the projection 409 faces the base substrate 400 side. The bond substrate 408 may partially overlap with the semiconductor films 404 and the semiconductor films 407, but the projection 409 included in the bond substrate 408 is disposed in a region different from the regions to which the semiconductor films 404 and the semiconductor films 407 have been transferred. Note that a case where the projection 409 is regular hexagonal is described as an example in this embodiment mode.

When the bond substrate 408 has a notch or a flat which indicates the plane orientation, the projection 409 is desirably formed so as not to overlap with the notch or the flat.

Figure 6D:
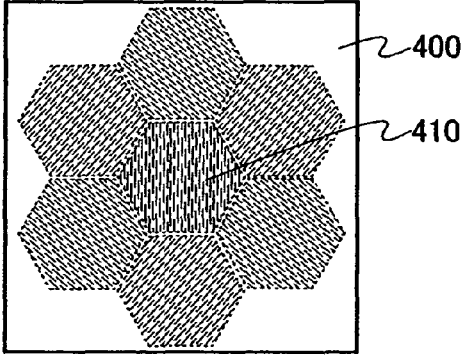

The bond substrate 408 is bonded to the base substrate 400 as illustrated in FIG. 6D and then divided at the projection 409, so that a semiconductor film 410 is transferred to the base substrate 400 as illustrated in FIG. 6D.

In the present invention, by using the bond substrates 405 with its end portion partially removed, the later transfer of the semiconductor films 407 can be carried out so that the semiconductor films 407 are not in contact with the semiconductor films 404 which have been transferred first and so that the semiconductor films 404 transferred first and the bond substrates 405 partially overlap with each other. Furthermore, in the present invention, by using the bond substrate 408 with its end portion partially removed, the later transfer of the semiconductor film 410 can be carried out so that the semiconductor film 410 is not in contact with either the semiconductor films 404 or the semiconductor films 407 which has been transferred previously and so that the bond substrate 408 partially overlaps with the semiconductor films 404 and the semiconductor films 407 which have been transferred previously. Therefore, the distance between the semiconductor film 404 transferred first, and each of the semiconductor film 407 and the semiconductor film 410 which are transferred later can be as small as several tens of micrometers; accordingly, the transferred semiconductor film 404, the transferred semiconductor film 407, and the transferred semiconductor film 410 can be used for one semiconductor device without the influence of the space among the semiconductor films.

In this embodiment mode, an end portion of not only the bond substrates 405 and the bond substrate 408 used for the later transfers but also the bond substrates 401 used for the first transfer is partially removed; however, the present invention is not limited to this structure. The present invention is acceptable as long as a bond substrate with its end portion partially removed is used in at least the transfer which is carried out later among a plurality of transfers. Note that it is difficult to transfer a portion of a semiconductor film, which is located at an end portion of a bond substrate, to a base substrate with high reproducibility. Therefore, the semiconductor films 404 can be transferred with high reproducibility in the case where end portions are partially removed in the bond substrates 401 used for the first transfer than in the case where the end portions are not partially removed. Thus, positional alignment of the bond substrates 405 and the bond substrate 408 which are bonded later can be made easier, and the distance among the semiconductor film 404, the semiconductor film 407, and the semiconductor film 410 can be made small.

Although this embodiment mode shows a case where the projections 402, the projections 406, and the projection 409 are regular hexagonal as an example, the present invention is not limited to this structure. The projections 402, the projections 406, and the projection 409 may have a polygonal shape of which the number of sides is three, four, five, seven, or greater, or a shape including a curved line such as a circle or an ellipse. However, when the projections 402, the projections 406, and the projection 409 have a regular triangular shape, a square shape, a rectangular shape, or a regular hexagonal shape, semiconductor films can be transferred to be spread over the base substrate 400 without making an unnecessary space between the semiconductor films. Especially when the projections 402, the projections 406, and the projection 409 have a regular hexagonal shape, the semiconductor films can be spread over the base substrate 400 without an unnecessary space, and furthermore, the area of a semiconductor film which is transferred to a base substrate from one circular bond substrate can be maximum.

This embodiment mode can be implemented in combination with any of the above embodiment modes as appropriate.

Embodiment Mode 5

In Embodiment Mode 5, a manufacturing method of a semiconductor device according to the present invention will be described, in which transfer of a semiconductor film from a bond substrate to a base substrate is carried out a plurality of times.

Figure 7A:
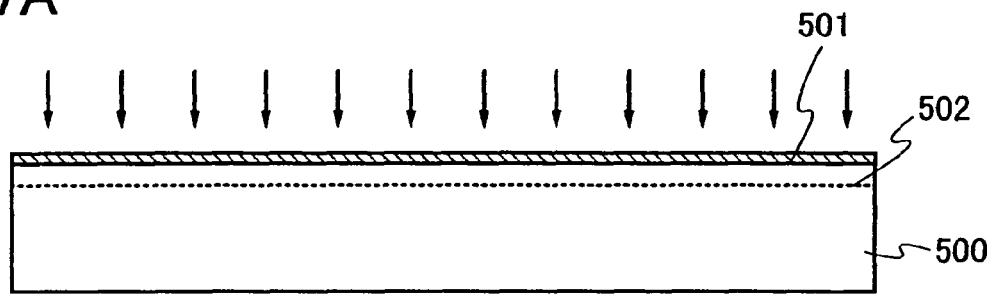
FIGS. 7A to 7C are cross-sectional views illustrating a manufacturing method of a semiconductor device according to the present invention.

As illustrated in FIG. 7A, an insulating film 501 is formed over a bond substrate 500. As the bond substrate 500, a single crystal semiconductor substrate or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 500. In addition, as the bond substrate 500, a semiconductor substrate formed of silicon having lattice distortion, silicon germanium in which germanium is added to silicon, or the like may also be used. Silicon having lattice distortion can be formed by formation of silicon on silicon germanium or silicon nitride which has larger lattice constant than silicon.

The insulating film 501 is formed using an insulating material such as silicon oxide, silicon nitride oxide, silicon nitride, or the like. The insulating film 501 may be a single-layer insulating film or a layer in which a plurality of insulating films is stacked. For example, in this embodiment mode, the insulating film 501 is used in which, from the bond substrate 500 side, silicon oxynitride in which the amount of oxygen is higher than that of nitrogen and silicon nitride oxide in which the amount of nitrogen is higher than that of oxygen are stacked.

For example, in the case of using silicon oxide for the insulating film 501, the insulating film 501 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 501 may be densified by oxygen plasma treatment. Alternatively, in the case of using silicon for the bond substrate 500, a surface of the bond substrate 500 can be thermally oxidized to form silicon oxide as the insulating film 501. In the case of using silicon nitride for the insulating film 501, the insulating film 501 can be formed by a vapor deposition method such as a plasma CVD method using a mixed gas of silane and ammonia. In the case of using silicon nitride oxide for the insulating film 501, the insulating film 501 can be formed by a vapor deposition method such as a plasma CVD method using a mixed gas of silane and ammonia or a mixed gas of silane and nitrogen oxide.

Alternatively, the insulating film 501 may be formed using silicon oxide which is formed with the use of an organic silane gas by a chemical vapor deposition method. As the organic silane gas, the following may be used: a silicon-containing compound such as ethyl silicate (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane (SiH $(OC_2H_5)_3$), or trisdimethylaminosilane ($SiH(N(CH_3)_2)_3$).

Next, as illustrated in FIG. 7A, hydrogen or a rare gas, or hydrogen ions or rare gas ions is introduced into the bond substrate 500 as indicated by arrows, whereby a fragile layer 502 having microvoids is formed in a region at a certain depth from a surface of the bond substrate 500. The position where the fragile layer 502 is formed is determined depending on acceleration voltage at the time of the above-described introduction. The thickness of a semiconductor film which is transferred from the bond substrate 500 to a base substrate 504 is determined by the position of the fragile layer 502; therefore, the acceleration voltage at the time of the introduction is determined in consideration of the thickness of the semiconductor film. Further, the position of the fragile layer 502 can be changed by not only the acceleration voltage at the time of the introduction but also the thickness of the insulating film 501. For example, when the thickness of the insulating film 501 is made larger, the thickness of the semiconductor film can be made smaller. The semiconductor film is formed to a thickness of, for example, 10 nm to 200 nm, and preferably 10 nm to 50 nm. For example, in the case where hydrogen is introduced into the bond substrate 500, the dose is desirably $1\times10^{16}/cm^2$ to $1\times10^{17}/cm^2$.

Note that since hydrogen or a rare gas, or hydrogen ions or rare gas ions is introduced into the bond substrate 500 at high concentration in the step of forming the fragile layer 502, the surface of the bond substrate 500 becomes rough and sufficient strength for bonding with the base substrate 504 cannot be obtained in some cases. By provision of the insulating film 501, the surface of the bond substrate 500 is protected at the time of the introduction of hydrogen or a rare gas, or hydrogen ions or rare gas ions, and the base substrate 504 and the bond substrate 500 can be favorably bonded to each other.

Figure 7B:
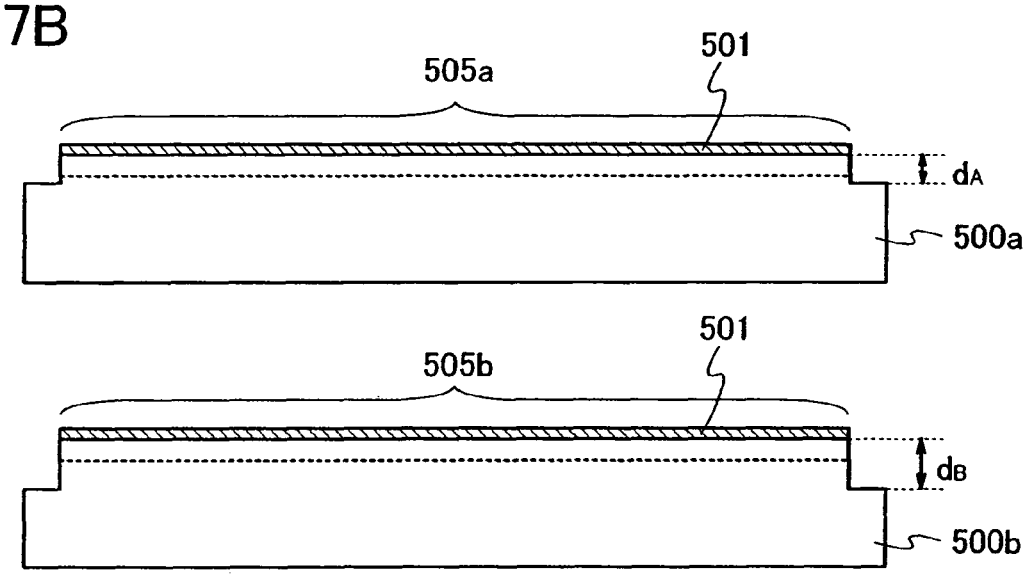

Next, an end portion of the bond substrate 500 is partially removed. In this embodiment mode, as illustrated in FIG. 7B, the end portion of the bond substrate 500 is partially removed together with an end portion of the insulating film 501, so that a bond substrate 500a having a projection 505a and a bond substrate 500b having a projection 505b are formed.

The bond substrate 500a is used for the first transfer. The width $d_A$ in a perpendicular direction (depth direction) to the bond substrate 500a, of the region of the bond substrate 500a corresponding to the removed end portion is equal to or larger than the thickness of a semiconductor film 506a which is transferred from the bond substrate 500a. In addition, the bond substrate 500b is used for the later transfer. The width $d_B$ in a perpendicular direction (depth direction) to the bond substrate 500b, of the region of the bond substrate 500b corresponding to the removed end portion is larger than the thickness of the semiconductor film 506a which is transferred first.

Specifically, the width $d_A$ in the depth direction of the region corresponding to the removed end portion, that is, the width $d_A$ in the perpendicular direction to the bond substrate 500a, of a region of the bond substrate 500a, which is included in the projection 505a is set at, for example, 10 nm or larger, and preferably 200 nm or larger in consideration of the thickness of the semiconductor film 506a. In addition, the width $d_B$ in the depth direction of the region corresponding to the removed end portion, that is, the width $d_B$ in the perpendicular direction to the bond substrate 500b, of a region of the bond substrate 500b, which is included in the projection 505b is set at, for example, several μm or larger, and preferably 10 μm or larger in consideration of the thickness of the semiconductor film 506a.

Each of the widths in a parallel direction to the bond substrate 500a and the bond substrate 500b, of the regions corresponding to the removed end portions may be several mm to several tens of mm, for example.

In this embodiment mode, an end portion of not only the bond substrate 500b used for the later transfer but also the bond substrate 500a used for the first transfer is partially removed; however, the present invention is not limited to this structure. The present invention is acceptable as long as a bond substrate with its end portion partially removed is used in at least the transfer which is carried out later among a plurality of transfers. Note that it is difficult to transfer a portion of a semiconductor film, which is located at an end portion of a bond substrate, to a base substrate. Therefore, the reproducibility of the shape of the transferred semiconductor film becomes higher in the case where an end portion is partially removed in the bond substrate 500a used for the first transfer than in the case where the end portion is not partially removed. Thus, positional alignment of the bond substrate 500b which is bonded later can be made easier, and the distance between the transferred semiconductor films can be made small.

Further, the width $d_A$ is smaller than the width $d_B$ in this embodiment mode; however, the present invention is not limited to this structure. The width $d_A$ may be equal to the width $d_B$ or may be larger than the width $d_B$.

Figure 7C:
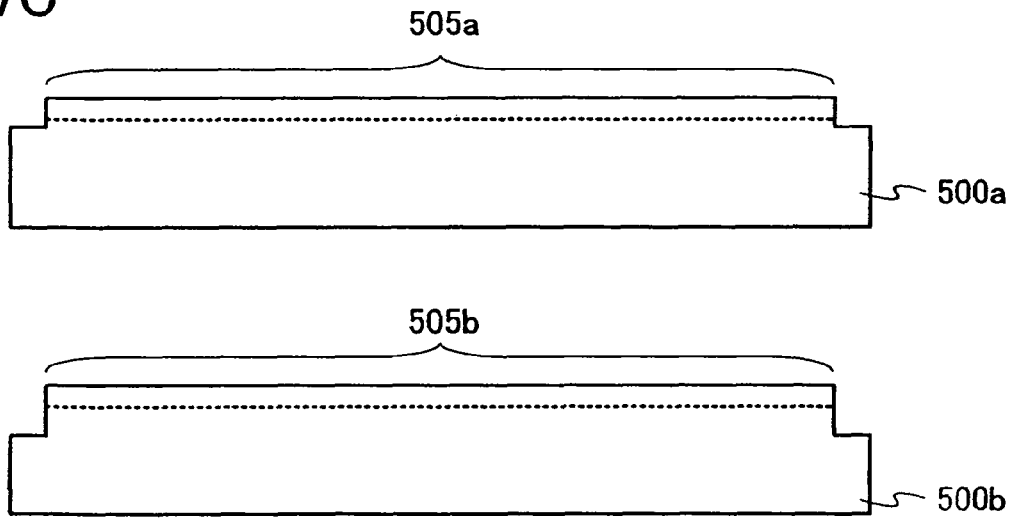

Next as illustrated in FIG. 7C, the insulating films 501 formed over the projection 505a and the projection 505b are removed. It is not always necessary to remove the insulating films 501. However, in the case where the surfaces of the insulating films 501 are rough due to doping for forming the above-described fragile layers 502, when the insulating films 501 is removed, surfaces of the projection 505a and the projection 505b, which have higher planarity, can be used for bonding; accordingly, bonding strength can be increased.

In the case where the above-described introduction of hydrogen or a rare gas, or hydrogen ions or rare gas ions is performed with an ion shower doping apparatus, impurities such as a heavy metal may remain in the insulating films 501. By removing the insulating films 501, the above-described impurities can also be removed.

After the removal of the insulating films 501, an insulating film may be formed over the projection 505a and the projection 505b. In this case, the insulating film is desirably formed with a thickness of 1 nm to 50 nm using an insulating material such as silicon oxide, silicon nitride oxide, or silicon nitride. Alternatively, the insulating film may be formed of silicon oxide which is formed by a chemical vapor deposition method using an organic silane gas. The insulating film may be a single-layer insulating film or a layer in which a plurality of insulating films is stacked. An insulating film formed using hydroxylation or plasma oxidation does not easily have surface unevenness caused by dusts unlike the insulating film formed by a vapor deposition method, whereby high planarity can be obtained. Therefore, when the above-described insulating film is formed over the projection 505a and the projection 505b using hydroxylation or plasma oxidation, strength of bonding which is performed later can be increased.

Next, before bonding the bond substrate 500a and the bond substrate 500b to the base substrate 504, the bond substrate 500a and the bond substrate 500b may be hydrogenated. The hydrogenation is performed, for example, at 350° C. in a hydrogen atmosphere for approximately two hours.

Figure 8A:
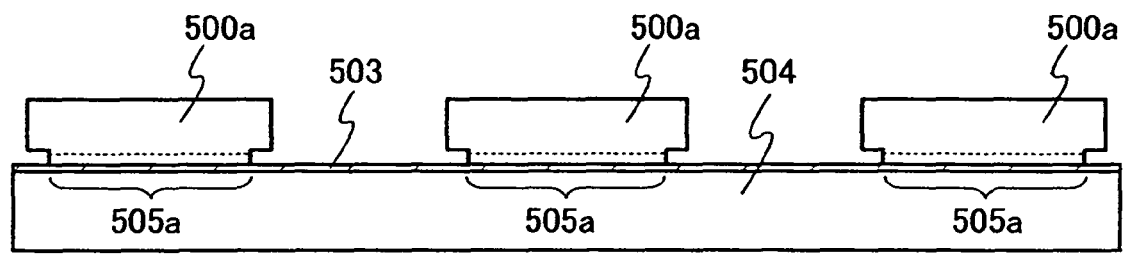
FIGS. 8A to 8D are cross-sectional views illustrating a manufacturing method of a semiconductor device according to the present invention.

Then, as illustrated in FIG. 8A, an insulating film 503 is formed over the base substrate 504. The insulating film 503 is formed using an insulating material such as silicon oxide, silicon nitride oxide, or silicon nitride, similar to the insulating film 501. The insulating film 503 may be formed using a single insulating film or a stack of a plurality of insulating films. As the insulating film 503, silicon oxide may be formed by a chemical vapor deposition method using an organic silane gas.

An insulating film having an excellent barrier property such as silicon nitride or silicon nitride oxide is used for the insulating film 503, whereby impurities such as an alkali metal or an alkaline-earth metal can be prevented from entering the semiconductor film 506a and the semiconductor film 506b which are to be transferred to the base substrate 504, from the base substrate 504.

In this embodiment mode, as the insulating film 503, an insulating film in which a silicon nitride oxide film containing a larger amount of nitrogen than oxygen, a silicon oxynitride film containing a larger amount of oxygen than nitrogen, and a silicon oxide film formed by a chemical vapor deposition method using an organic silane gas are stacked in this order from the side near the base substrate 504 is used.

As illustrated in FIG. 8A, the bond substrate 500a is bonded to the base substrate 504 so that the projection 505a faces the base substrate 504 side, that is, the insulating film 503 is interposed between the bond substrate 500a and the base substrate 504. The insulating film 503 and the bond substrate 500a are bonded to each other at the projection 505a, whereby the bond substrate 500a and the base substrate 504 can be bonded together.

The bonding is performed by van der Waals forces, so that strong bonding can be formed even at room temperature. Note that since the above-described bonding can be performed at a low temperature, various substrates can be used for the base substrate 504. As the base substrate 504, for example, a substrate such as a quartz substrate or a sapphire substrate can be used as well as a glass substrate made of aluminosilicate glass, barium borosilicate glass, aluminoborosilicate glass, or the like. Furthermore, as the base substrate 504, a semiconductor substrate formed of silicon, gallium arsenide, indium phosphide, or the like can be used. Alternatively, a metal substrate including a stainless-steel substrate can be used as the base substrate 504.

Heat treatment or pressure treatment may be performed after the base substrate 504 and the bond substrate 500a are bonded to each other. The bonding strength can be increased with heat treatment or pressure treatment.

Figure 8B:
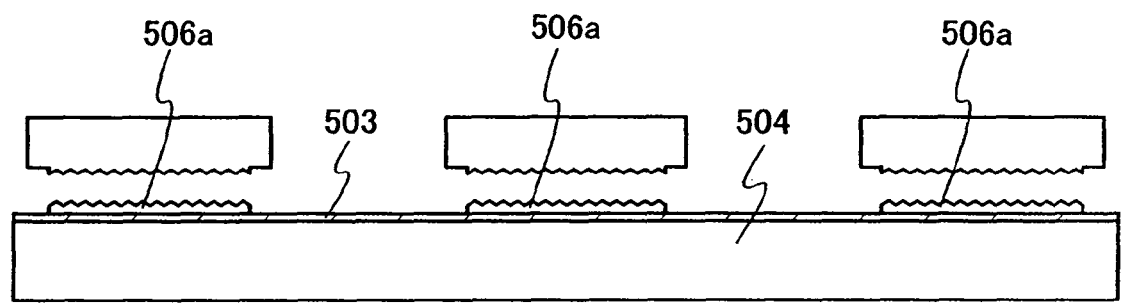

Heat treatment is performed after the bond substrate 500a and the base substrate 504 are bonded to each other, and thereby the adjacent microvoids in the fragile layer 502 are coupled, and the volume of the microvoid is increased. As a result, as illustrated in FIG. 8B, the bond substrate 500a is split or divided along the fragile layer 502; thus, the semiconductor film 506a which has been part of the bond substrate 500a is separated from the bond substrate 500a. The heat treatment is preferably performed at a temperature that is equal to or lower than the allowable temperature limit of the base substrate 504. For example, heat treatment may be performed at a temperature ranging from 400° C. to 600° C. By this separation, the semiconductor film 506a is transferred to the base substrate 504. After that, heat treatment at a temperature ranging from 400° C. to 600° C. is preferably performed in order to make the attachment between the insulating film 503 and the semiconductor film 506a stronger.

Figure 8C:
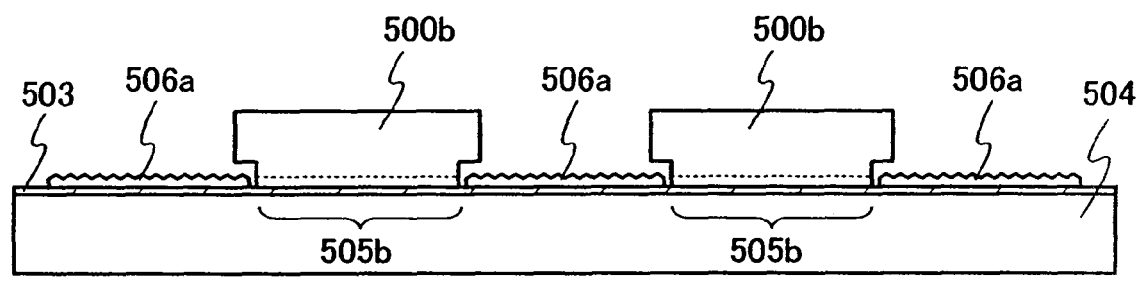

Next, as illustrated in FIG. 8C, the bond substrate 500b is bonded to the base substrate 504 so that the projection 505b faces the base substrate 504 side, that is, the insulating film 503 is interposed between the bond substrate 500b and the base substrate 504. The insulating film 503 and the bond substrate 500b are bonded to each other at the projection 505b, whereby the bond substrate 500b and the base substrate 504 can be bonded together.

Note that the bonding of the bond substrate 500b is carried out in such a manner that the projection 505b is disposed in a region other than the region including the semiconductor film 506a which has been transferred first. Since the end portion of the bond substrate 500b is partially removed in the present invention, the projection 505b can be disposed close to the semiconductor film 506a without causing contact between the bond substrate 500b and the semiconductor film 506a, to such an extent that the bond substrate 500b and the semiconductor film 506a are partially overlapped with each other.

The bonding is performed by van der Waals forces similarly to the first transfer, so that strong bonding can be formed even at room temperature. Heat treatment or pressure treatment may be performed after the base substrate 504 and the bond substrate 500b are bonded to each other. The bonding strength can be increased with heat treatment or pressure treatment.

Figure 8D:
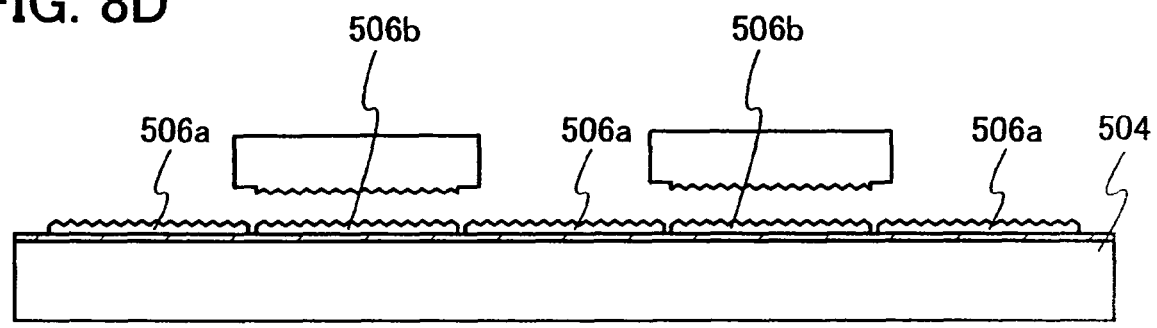

Heat treatment is performed after the bond substrate 500b and the base substrate 504 are bonded to each other, and thereby the adjacent microvoids in the fragile layer 502 are coupled, and the volume of the microvoid is increased. As a result, as illustrated in FIG. 8D, the bond substrate 500b is split or divided along the fragile layer 502; thus, the semiconductor film 506b which has been part of the bond substrate 500b is separated from the bond substrate 500b. The heat treatment is preferably performed at a temperature that is equal to or lower than the allowable temperature limit of the base substrate 504. For example, heat treatment may be performed at a temperature ranging from 400° C. to 600° C. By this separation, the semiconductor film 506b is transferred to the base substrate 504. After that, heat treatment at a temperature ranging from 400° C. to 600° C. is preferably performed in order to make the attachment between the insulating film 503 and the semiconductor film 506b stronger.

Crystal plane orientation of the semiconductor film 506a and the semiconductor film 506b can be controlled by the plane orientation of the bond substrate 500a and the bond substrate 500b, respectively. The bond substrate 500a and the bond substrate 500b each having crystal plane orientation which is suitable for a semiconductor element to be formed may be selected as appropriate. The mobility of the transistors depends on the crystal plane orientation of the semiconductor film 506a and the semiconductor film 506b. In order to obtain transistors with higher mobility, the direction of bonding the bond substrate 500a and the bond substrate 500b is set in consideration of the direction of channels and the crystal plane orientation.

Note that the insulating film 503 is not necessarily formed on the surface of the base substrate 504. In this case, the base substrate 504 is bonded to the bond substrate 500a and the bond substrate 500b by direct contact. Note that by formation of the insulating film on the surface of the base substrate 504, impurities such as an alkali metal or an alkaline-earth metal can be prevented from entering the semiconductor film 506a and the semiconductor film 506b from the base substrate 504. Further, if the insulating film 503 is formed on the surface of the base substrate 504, bonding is performed between the insulating film 503, and the bond substrate 500a and the bond substrate 500b; accordingly, the bonding can be performed regardless of the kind of the base substrate 504.

Figure 9A:
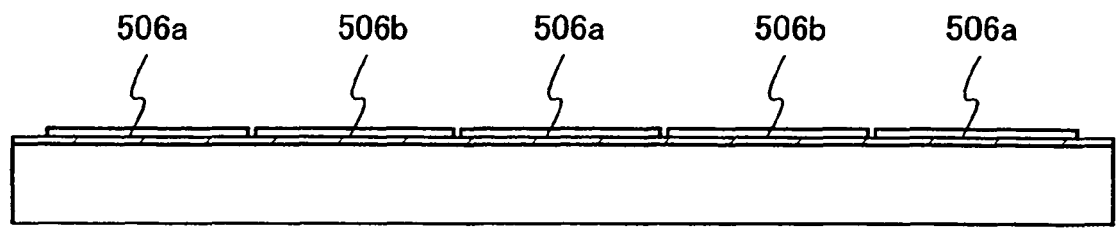
FIGS. 9A and 9B are cross-sectional views illustrating a manufacturing method of a semiconductor device according to the present invention.

Next, as illustrated in FIG. 9A, a surface of the transferred semiconductor film 506a and a surface of the transferred semiconductor film 506b are planarized. Although the planarization is not necessarily essential, the planarization makes it possible to improve characteristics of the interface between a gate insulating film, and the semiconductor film 506a and the semiconductor film 506b in the transistors to be formed later. Specifically, the planarization can be performed by chemical mechanical polishing (CMP), liquid jet polishing, or the like. The thickness of the semiconductor film 506a and the semiconductor film 506b is reduced by the above-described planarization.

Although this embodiment mode describes the case where a Smart Cut (registered trademark) method is used in which the semiconductor film 506a and the semiconductor film 506b are separated from the bond substrate 500a and the bond substrate 500b, respectively, using the fragile layer 502, another bonding method such as ELTRAN (epitaxial layer transfer), a dielectric isolation method, or a PACE (plasma assisted chemical etching) method may be used.

Figure 9B:
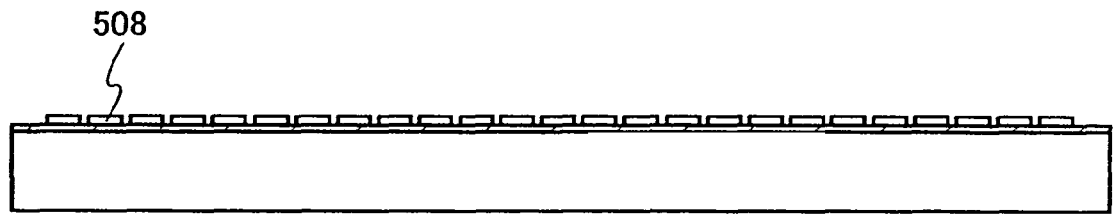

Next, as illustrated in FIG. 9B, the planarized semiconductor film 506a and the planarized semiconductor film 506b are processed (patterned) into desired shapes, so that island-shaped semiconductor films 508 are formed. Note that element isolation may be performed by a selective oxidation method (LOCOS: local oxidation of silicon), a shallow trench isolation (STI) method, or the like instead of patterning of the semiconductor films.

Using the island-shaped semiconductor films 508 formed through the above-described process, various kinds of semiconductor elements such as a transistor can be formed in the present invention.

In the present invention, by using the bond substrate 500b with its end portion partially removed, the later transfer of the semiconductor film 506b can be carried out so that the semiconductor film 506b is not in contact with the semiconductor film 506a which has been transferred first and so that the semiconductor film 506b partially overlaps with the semiconductor film 506a which has been transferred first. Therefore, the distance between the semiconductor film 506a transferred first and the semiconductor film 506b transferred later can be as small as several tens of micrometers; accordingly, the transferred semiconductor film 506a and the transferred semiconductor film 506b can be used for one semiconductor device without the influence of the space between the semiconductor films.

This embodiment mode can be implemented in combination with any of the above embodiment modes as appropriate.

Embodiment Mode 6

A process will be described in Embodiment Mode 6, in which a semiconductor film is formed to fill the space between the semiconductor film 506a and the semiconductor film 506b and then the semiconductor film is crystallized after the steps up to and including the step shown in FIG. 8D of Embodiment Mode 5.

Figure 10A:
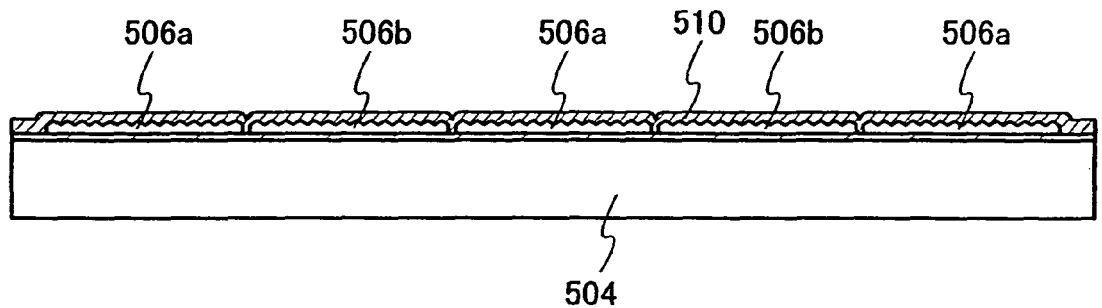
FIGS. 10A to 10D are cross-sectional views illustrating a manufacturing method of a semiconductor device according to the present invention.

After the steps up to and including the step shown in FIG. 8D of Embodiment Mode 5 are completed, a semiconductor film 510 is formed over the base substrate 504 so as to cover the semiconductor film 506a and the semiconductor film 506b as illustrated in FIG. 10A. Note that in this embodiment mode, it is desirable to remove the insulating film 501 over the bond substrate 500a and the bond substrate 500b as illustrated in the step of FIG. 7C. The semiconductor film 510 may cover an entire surface of the semiconductor film 506a and the semiconductor film 506b or may partially cover the semiconductor film 506a and the semiconductor film 506b so as to fill the space between the semiconductor film 506a and the semiconductor film 506b. The thickness of the semiconductor film 510 is approximately equal to or greater than the thicknesses of the semiconductor film 506a and the semiconductor film 506b.

Figure 10B:
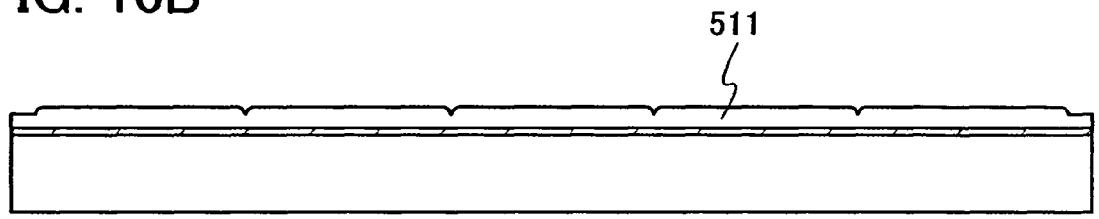

Next, as illustrated in FIG. 10B, the semiconductor film 510 is crystallized by epitaxial growth using the semiconductor film 506a and the semiconductor film 506b which have crystallinity. The semiconductor film 510 is crystallized; thus, a semiconductor film 511 having crystallinity is formed from the semiconductor film 506a, the semiconductor film 506b, and the semiconductor film 510. The epitaxial growth can be performed by thermal treatment, light irradiation, electronic beam irradiation, or the like. In this embodiment mode, the semiconductor film 510 is crystallized by epitaxial growth using a laser.

When a pulsed laser is used, in the case of an excimer laser for example, laser beam irradiation may be carried out with an energy density of 1 J/cm$^2$ to 2 J/cm$^2$. In addition, when a continuous-wave laser is used, in the case of a second harmonic of a Nd:YVO$_4$ laser for example, laser beam irradiation may be carried out in the condition that the width of a beam is set to be larger than the length of the space between the semiconductor film 506a and the semiconductor film 506b and the scanning speed is 15 m/sec.

As a pulsed laser, an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper-vapor laser, or a gold-vapor laser can be used for example.

Note that as a continuous-wave gas laser, an Ar laser, a Kr laser, or the like can be used. Further, as a continuous-wave solid-state laser, a YAG laser, a YVO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, or the like can be used.

The entire surface of the semiconductor film 506a, the semiconductor film 506b, and the semiconductor film 510 may be irradiated with a laser beam, or a portion of the semiconductor film 510, which is located between the semiconductor film 506a and the semiconductor film 506b may be irradiated with a laser beam.

This embodiment mode has described an example of causing solid-phase growth of crystals in the semiconductor film 510; however, the present invention is not limited to this structure. A gas containing an atom used in the crystals may be supplied to the heated base substrate 504, so as to form a semiconductor film having crystallinity by vapor-phase growth of the semiconductor film 506a and the semiconductor film 506b.

Figure 10C:
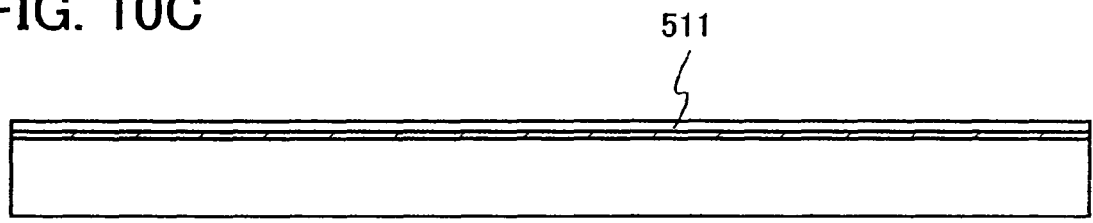

Next, as illustrated in FIG. 10C, the semiconductor film 511 is planarized by chemical mechanical polishing (CMP), liquid jet polishing, or the like. In the case where only the portion located between the semiconductor film 506a and the semiconductor film 506b is crystallized in the semiconductor film 510, an uncrystallized portion of the semiconductor film 510, which is over the semiconductor film 506a and the semiconductor film 506b, can be removed by the above polishing.

Figure 10D:
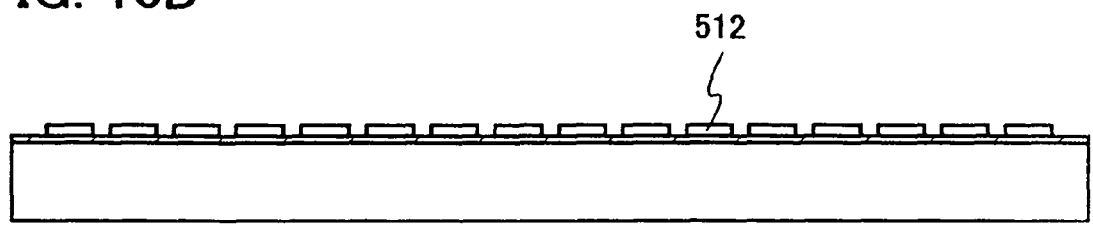

Next, as illustrated in FIG. 10D, the planarized semiconductor film 511 is processed (patterned) into desired shapes, so that island-shaped semiconductor films 512 are formed. Note that element isolation may be performed by a selective oxidation method (LOCOS: local oxidation of silicon), a shallow trench isolation (STI) method, or the like instead of patterning of the semiconductor film.

Using the island-shaped semiconductor films 512 formed through the above-described process, various kinds of semiconductor elements such as a transistor can be formed using the present invention.

In this embodiment mode, the semiconductor film 511 can be formed so as to fill the space between the semiconductor film 506a and the semiconductor film 506b; accordingly, the constrains to the layout of semiconductor elements owing to the above-mentioned space can be removed. Further, since the distance between the semiconductor film 506a and the semiconductor film 506b can be as small as several tens of micrometers in the present invention, the time required for crystallizing the semiconductor film 510 by the above-described epitaxial growth can be shortened.

This embodiment mode can be implemented in combination with any of the above embodiment modes as appropriate.

Embodiment Mode 7

In Embodiment Mode 7, a mode of a method for dividing a bond substrate will be described, which is used in the manufacturing method of a semiconductor device described in Embodiment Mode 1 and Embodiment Mode 6.

First, hydrogen or a rare gas, or hydrogen ions or rare gas ions is introduced into a bond substrate, whereby a fragile layer having microvoids is formed in a region at a certain depth from a surface of the bond substrate. In this embodiment mode, after the bond substrate is attached to a base substrate so as to be bonded, the bond substrate is selectively subjected to heat treatment by using dielectric heating with a high-frequency wave such as a microwave. Note that the bond substrate and the base substrate are not wholly heated in this embodiment mode.

The heat treatment using the dielectric heating can be performed by irradiating the bond substrate with a high-frequency wave with a frequency of 300 MHz to 3 THz produced by a high-frequency generator. In this embodiment mode, the irradiation is carried out with a microwave of 2.45 GHz at 900 W for 14 hours to couple the adjacent microvoids in the fragile layer; thus, the bond substrate is finally divided.

In this embodiment mode, a substrate which easily transmits the above-described high-frequency wave without absorption is used as the base substrate. For example, a glass substrate made of aluminosilicate glass, barium borosilicate glass, aluminoborosilicate glass, or the like, a ceramic substrate of silicon carbide or the like, a sapphire substrate, or the like can be used as the base substrate.

If the bond substrate and the base substrate are wholly subjected to heat treatment in order to divide the bond substrate along the fragile layer, the base substrate may suffer change of properties such as shrinkage, depending on the kind of the base substrate. In the case where division of the bond substrate is conducted over the base substrate a plurality of times as in the present invention, the bond substrate can be selectively heated; accordingly, change of properties can be prevented in the base substrate and generation of a trouble due to the change of properties in the base substrate can be prevented in and after the second-time transfer of a semiconductor film.

This embodiment mode can be implemented in combination with any of the above embodiment modes as appropriate.

Embodiment Mode 8

In Embodiment Mode 8, a specific example of a manufacturing method of a transistor which is used in the present invention will be described.

Figure 11A:
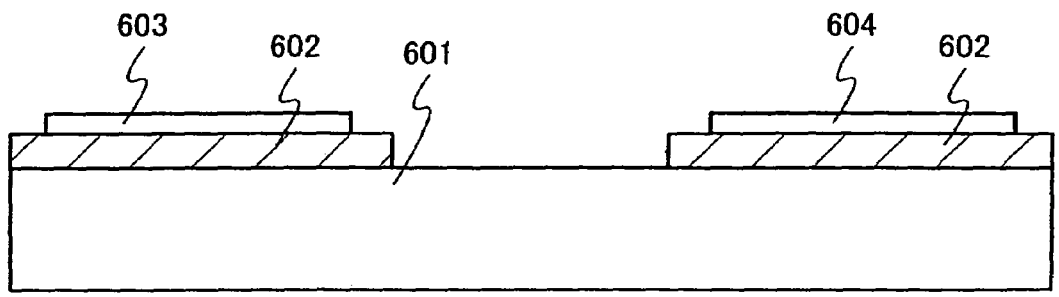
FIGS. 11A to 11D are cross-sectional views illustrating a manufacturing method of a semiconductor device according to the present invention.

As illustrated in FIG. 11A, an island-shaped semiconductor film 603 and an island-shaped semiconductor film 604 are formed over a base substrate 601. An insulating film 602 is provided between the base substrate 601 and the island-shaped semiconductor film 603 and between the base substrate 601 and the island-shaped semiconductor film 604. The insulating film 602 may be either a single insulating film or stacked layers of a plurality of insulating films.

An impurity element may be added to the island-shaped semiconductor films 603 and 604 in order to control the threshold voltage. For example, in the case of adding boron as a p-type impurity element, boron is preferably added at a concentration of greater than or equal to $5 \times 10^{17}$ cm$^{-3}$ and less than or equal to $1 \times 10^{18}$ cm$^{-3}$. The addition of the impurity element for controlling the threshold voltage may be performed before the semiconductor film is transferred to the base substrate 601 or after the transfer.

Hydrogenation treatment may be performed after the island-shaped semiconductor films 603 and 604 are formed and before gate insulating films 606 are formed. For example, the hydrogenation treatment is performed at 350° C. for about 2 hours in a hydrogen atmosphere.

Figure 11B:
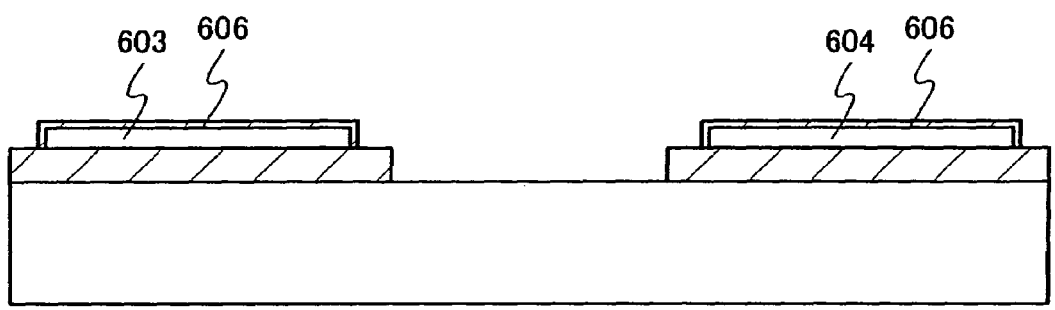

As illustrated in FIG. 11B, the gate insulating films 606 are formed to cover the island-shaped semiconductor films 603 and 604. Surfaces of the island-shaped semiconductor films 603 and 604 may be oxidized or nitrided by high-density plasma treatment, so that the gate insulating films 606 can be formed. High-density plasma treatment is performed using, for example, a mixed gas of a rare gas such as He, Ar, Kr, or Xe and oxygen, nitrogen oxide, ammonium, nitrogen, hydrogen, or the like. In this case, when plasma is excited by introduction of microwaves, plasma with a low electron temperature and high density can be generated. The surfaces of the semiconductor films are oxidized or nitrided by oxygen radicals (OH radicals may be included) or nitrogen radicals (NH radicals may be included) which are generated by such high-density plasma, whereby insulating films are formed to a thickness of 1 nm to 20 nm, desirably 5 nm to 10 nm so as to be in contact with the semiconductor films. The insulating films with a thickness of 5 nm to 10 nm are used as the gate insulating film 606.

Since the oxidation or nitridation of the semiconductor films by the above-described high-density plasma treatment progresses under a solid state reaction, interface state density between the gate insulating films 606 and the island-shaped semiconductor films 603 and 604 can be extremely low. In addition, if the semiconductor films are directly oxidized or nitrided by the high-density plasma treatment, variation in the thickness of the insulating film which is to be formed can be suppressed. Moreover, in the case where the semiconductor films have crystallinity, when the surfaces of the semiconductor films are oxidized by solid state reaction using the high-density plasma treatment, rapid oxidation only in crystal grain boundaries can be prevented and the gate insulating films with good uniformity and low interface state density can be formed. A transistor including the insulating film formed by the high-density plasma treatment in part of the gate insulating film or as the whole gate insulating film of the transistor can have little variation in the characteristics.

Alternatively, the gate insulating films 606 may be formed by thermally oxidizing the island-shaped semiconductor films 603 and 604. The gate insulating films 606 may be formed of a single layer or stacked layers of a film including silicon oxide, silicon oxynitride, silicon nitride oxide, silicon nitride, hafnium oxide, aluminum oxide, or tantalum oxide, by a plasma CVD method, a sputtering method, or the like.

Figure 11C:
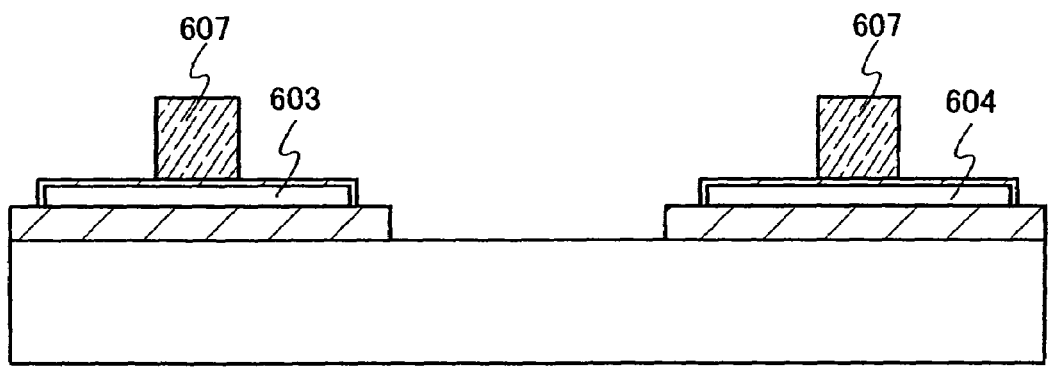

Next, as illustrated in FIG. 11C, a conductive film is formed over the gate insulating films 606, and then the conductive film is processed (patterned) into predetermined shapes, whereby electrodes 607 are formed over the island-shaped semiconductor films 603 and 604. A CVD method, a sputtering method, or the like can be used for forming the conductive film. Tantalum (Ta), tungsten (W), titanium (Ti), molybdenum (Mo), aluminum (Al), copper (Cu), chromium (Cr), niobium (Nb), or the like can be used for forming the conductive film. Alternatively, an alloy containing the above-described metal as its main component or a compound containing the above-described metal may be used. Further alternatively, the conductive film may be formed using a semiconductor such as polycrystalline silicon which is formed by addition of an impurity element imparting a conductivity type, such as phosphorus, to a semiconductor film.

As a combination of two conductive films, tantalum nitride or tantalum (Ta) can be used for a first layer, and tungsten (W) can be used for a second layer. Besides the above-described example, tungsten nitride and tungsten; molybdenum nitride and molybdenum; aluminum and tantalum; aluminum and titanium; and the like can be given. Since tungsten and tantalum nitride have high thermal resistance, thermal treatment for thermal activation can be performed after the two conductive films are formed. As a combination of the two conductive films, for example, silicon doped with an impurity element imparting n-type conductivity and NiSi (nickel silicide); silicon doped with an impurity element imparting n-type conductivity and WSix; or the like can be used.

In addition, although each of the electrodes 607 is formed of a single-layer conductive film in this embodiment mode, this embodiment mode is not limited to this structure. Each of the electrodes 607 may be formed of a plurality of conductive films which is stacked. In the case of a three-layer structure in which three or more conductive films are stacked, a stacked structure including a molybdenum film, an aluminum film, and a molybdenum film may be used.

As masks used for forming the electrodes 607, instead of resist, silicon oxide, silicon oxynitride, or the like may be used. Although, in this case, a step of forming the masks made of silicon oxide, silicon oxynitride, or the like by patterning is added, the reduction in film thickness and width of the mask at the time of etching is less than that in the case of using a resist mask; accordingly, the electrodes 607 each having a desired width can be formed. Alternatively, the electrodes 607 may be formed selectively by a droplet discharge method without using the masks.

Note that a droplet discharge method refers to a method in which droplets containing a predetermined composition are discharged from a small nozzle to form a predetermined pattern, and an ink-jet method or the like is included in the category.

The electrodes 607 can be etched into desired tapered shapes by ICP (inductively coupled plasma) etching and appropriate control of the etching conditions (e.g., the amount of electric power applied to a coiled electrode layer, the amount of electric power applied to an electrode layer on the substrate side, and the electrode temperature on the substrate side). The angle or the like of the tapered shapes depends on the shape of the masks. Note that as an etching gas, a chlorine-based gas such as chlorine, boron chloride, silicon chloride or carbon tetrachloride; a fluorine-based gas such as carbon tetrafluoride, sulfur fluoride, or nitrogen fluoride; or oxygen can be used as appropriate.

Figure 11D:
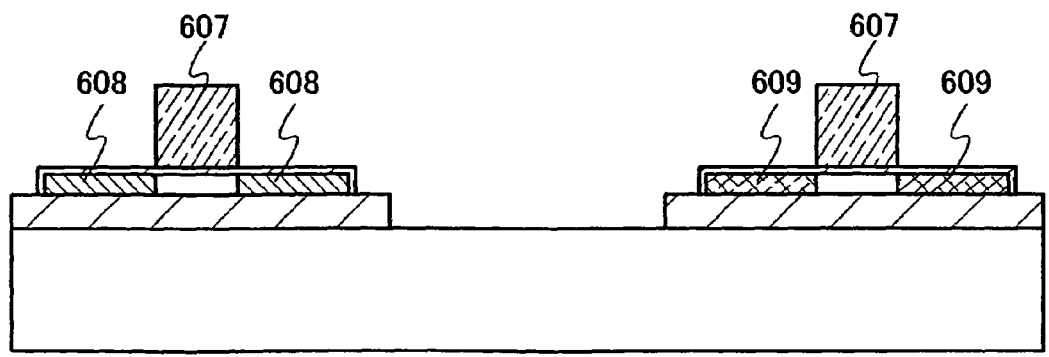

Next, as illustrated in FIG. 11D, an impurity element imparting one conductivity type is added to the semiconductor films 603 and 604 with the use of the electrodes 607 as masks. In this embodiment mode, an impurity element imparting p-type conductivity (e.g., boron) is added to the semiconductor film 604, and an impurity element imparting n-type conductivity (e.g., phosphorus or arsenic) is added to the semiconductor film 603. Note that when the impurity element imparting p-type conductivity is added to the semiconductor film 604, the semiconductor film 603 to which the n-type impurity element is added is covered with a mask or the like so that the addition of the impurity element imparting p-type conductivity can be performed selectively. On the other hand, when the impurity element imparting n-type conductivity is added to the semiconductor film 603, the semiconductor film 604 to which the p-type impurity element is added is covered with a mask or the like so that the addition of the impurity element imparting n-type conductivity can be performed selectively. Alternatively, after the impurity element imparting one conductivity of p-type and n-type is first added to the semiconductor film 603 and the semiconductor film 604, the impurity element imparting the other conductivity of p-type and n-type may be selectively added to only one of the semiconductor film 603 or the semiconductor film 604 at higher concentration. By the above-described addition of the impurity element, impurity regions 608 and 609 are formed in the semiconductor films 603 and 604, respectively.

Figure 12A:
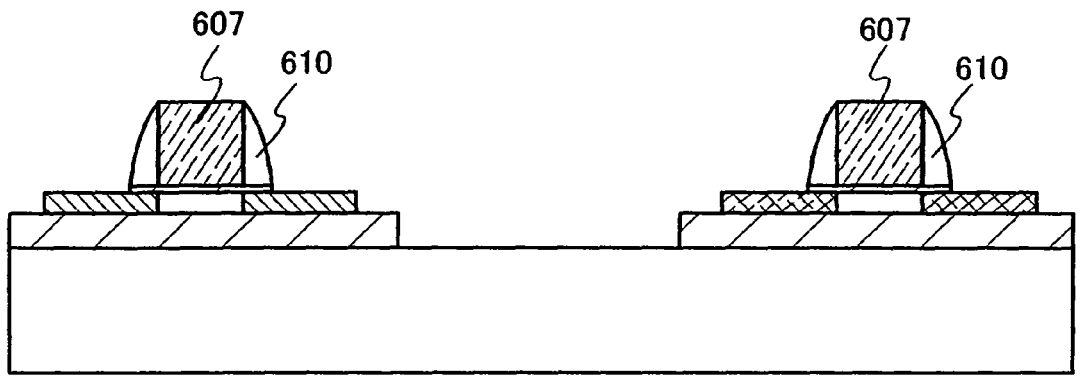
FIGS. 12A to 12C are cross-sectional views illustrating a manufacturing method of a semiconductor device according to the present invention.

Next, as illustrated in FIG. 12A, sidewalls 610 are formed on side surfaces of the electrodes 607. For example, the sidewalls 610 can be formed in such a manner that an insulating film is newly formed so as to cover the gate insulating films 606 and the electrodes 607, and the newly-formed insulating film is partially etched by anisotropic etching in which etching is performed mainly in a perpendicular direction. The newly-formed insulating film is partially etched by the above-described anisotropic etching, whereby the sidewalls 610 are formed on the side surfaces of the electrodes 607. The gate insulating films 606 may be partially etched by the above-described anisotropic etching. The insulating film for forming the sidewalls 610 may be formed of a single layer such as a silicon film, a silicon oxide film, a silicon oxynitride film, or a silicon nitride oxide film, or a film containing an organic material such as an organic resin which are formed by a plasma CVD method, a sputtering method, or the like, or a laminate thereof. In this embodiment mode, a silicon oxide film is formed to a thickness of 100 nm by a plasma CVD method. In addition, as an etching gas, a mixed gas of $CHF_3$ and He can be used. Note that the steps of forming the sidewalls 610 are not limited to these steps.

Figure 12B:
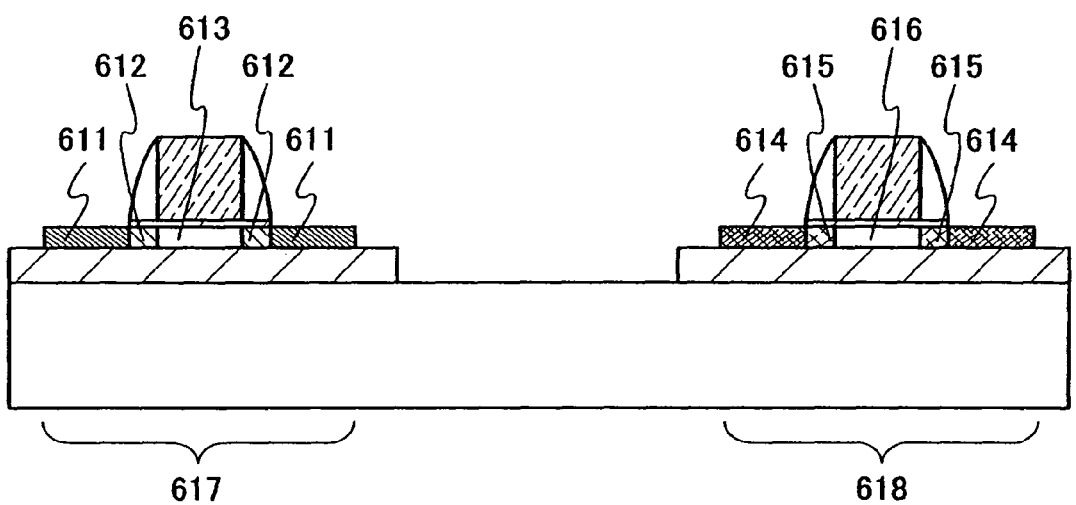

Next, as illustrated in FIG. 12B, an impurity element imparting one conductivity type is added to the semiconductor films 603 and 604 with the use of the electrodes 607 and the sidewalls 610 as masks. Note that the impurity elements imparting the same conductivity type as the impurity elements which have been added to the semiconductor films 603 and 604 in the previous step are added to the semiconductor films 603 and 604 at higher concentrations than those in the previous step. Note that when the impurity element imparting p-type conductivity is added to the semiconductor film 604, the semiconductor film 603 to which the n-type impurity element is added is covered with a mask or the like so that the addition of the impurity element imparting p-type conductivity can be performed selectively. On the other hand, when the impurity element imparting n-type conductivity is added to the semiconductor film 603, the semiconductor film 604 to which the p-type impurity element is added is covered with a mask or the like so that the addition of the impurity element imparting n-type conductivity can be performed selectively.

By the above-described addition of the impurity element, a pair of high-concentration impurity regions 611, a pair of low-concentration impurity regions 612, and a channel formation region 613 are formed in the semiconductor film 603. In addition, by the above-described addition of the impurity element, a pair of high-concentration impurity regions 614, a pair of low-concentration impurity regions 615, and a channel formation region 616 are formed in the semiconductor film 604. The high-concentration impurity regions 611 and 614 function as sources and drains, and the low-concentration impurity regions 612 and 615 function as LDD (lightly doped drain) regions.

Note that the sidewalls 610 formed over the semiconductor film 604 and the sidewalls 610 formed over the semiconductor film 603 may be formed so as to have the same width in the carrier flow direction, or may be formed so as to have different widths. It is preferable that the width of each sidewall 610 over the semiconductor film 604 which constitutes a part of a p-channel transistor be larger than the width of each sidewall 610 over the semiconductor film 603 which constitutes a part of an n-channel transistor. This is because boron which is added for forming a source and a drain in the p-channel transistor is easily diffused and a short channel effect is easily induced. When the width of each sidewall 610 in the p-channel transistor is made larger than that of each sidewall 610 in the n-channel transistor, boron can be added to the source and the drain at high concentration, and thus the resistance of the source and the drain can be reduced.

Next, a silicide layer may be formed by silicification of the semiconductor films 603 and 604 in order to further reduce the resistance of the source and the drain. The silicification is performed in such a manner that a metal is brought into contact with the semiconductor films, and silicon in the semiconductor films is made to react with the metal by heat treatment, a GRTA method, an LRTA method, or the like. Cobalt silicide or nickel silicide may be used for the silicide layer. In the case where the semiconductor films 603 and 604 are thin, silicide reaction may proceed to bottoms of the semiconductor films 603 and 604 in this region. As a metal material used for the silicification, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Alternatively, silicide may be formed by laser irradiation or light irradiation using a lamp or the like.

Through the above-described series of steps, an n-channel transistor 617 and a p-channel transistor 618 are manufactured.

Figure 12C:
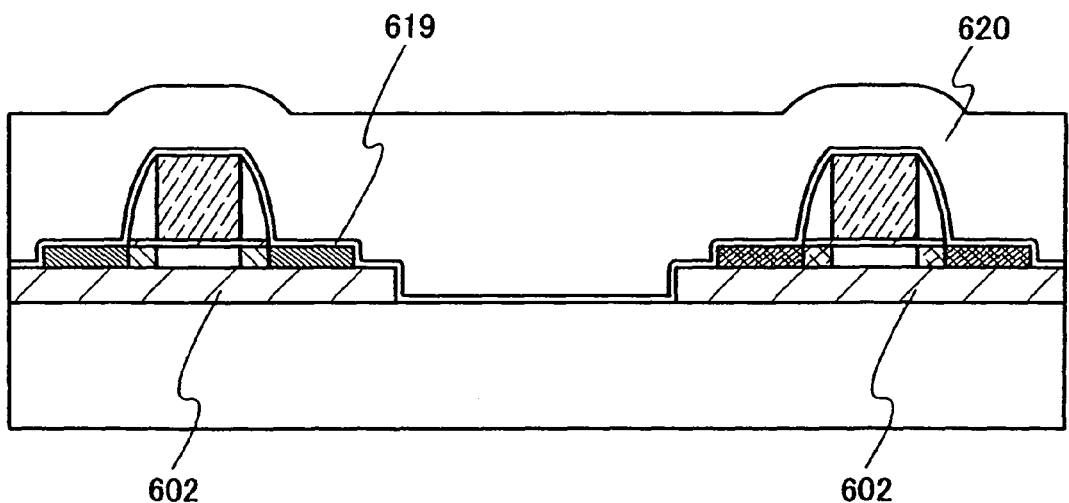

Next, as illustrated in FIG. 12C, an insulating film 619 is formed to cover the transistors 617 and 618. Although the insulating film 619 is not necessarily provided, the provision of the insulating film 619 makes it possible to prevent impurities such as an alkali metal or an alkaline-earth metal from entering the transistors 617 and 618. Specifically, it is desirable to use silicon nitride, silicon nitride oxide, silicon oxynitride, aluminum nitride, aluminum oxide, silicon oxide, or the like for the insulating film 619. In this embodiment mode, a silicon oxynitride film formed to a thickness of about 600 nm is used as the insulating film 619. In this case, the above-described hydrogenation step may be performed after the formation of the silicon oxynitride film.

Next, an insulating film 620 is formed over the insulating film 619 so as to cover the transistors 617 and 618. An organic material having heat resistance, such as polyimide, acrylic, benzocyclobutene, polyamide, or epoxy can be used for the insulating film 620. Besides the above-described organic material, the following can be used: a low dielectric constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like. The siloxane-based resin may include, besides hydrogen, at least one of fluorine, an alkyl group, or aromatic hydrocarbon as a substituent. Note that the insulating film 620 may be formed of a layer in which a plurality of insulating films each formed of the above-described material is stacked. A surface of the insulating film 620 may be planarized by a CMP method, liquid jet polishing, or the like.

In the case where the island-shaped semiconductor film 603 and the island-shaped semiconductor film 604 are formed from semiconductor films which are transferred at different timings, the insulating films 602 are, in some cases, separated from each other between the island-shaped semiconductor film 603 and the island-shaped semiconductor film 604 as illustrated in FIG. 12C depending on the manufacturing method. However, when the insulating film 620 is formed by a coating method using polyimide, a siloxane-based resin, or the like for example, planarity of a surface of the insulating film 620 can be prevented from being damaged due to a step difference formed between the insulating films 602. Since generation of surface unevenness which is caused due to the step difference between the insulating films 602 and the base substrate 601 can be prevented, it can be prevented from occurring that part of a conductive film 621 and a conductive film 622 to be formed over the insulating film 620 is very thin or, at worst, that the conductive film 621 or the conductive film 622 is disconnected. Thus, by formation of the conductive film 620 by a coating method, yield and reliability of a semiconductor device formed using the present invention can be increased in the end.

Note that the siloxane-based resin corresponds to a resin including a Si—O—Si bond formed using a siloxane-based material as a starting material. The siloxane-based resin may include, besides hydrogen, at least one of fluorine, an alkyl group, or aromatic hydrocarbon as a substituent.

For the formation of the insulating film 620, the following method can be used depending on the material of the insulating film 620: a CVD method, a sputtering method, an SOG method, a spin coating method, a dip coating method, a spray coating method, a droplet discharge method (e.g., an inkjet method, screen printing, or an offset printing), a doctor knife, a roll coater, a curtain coater, a knife coater, or the like.

Figure 13:
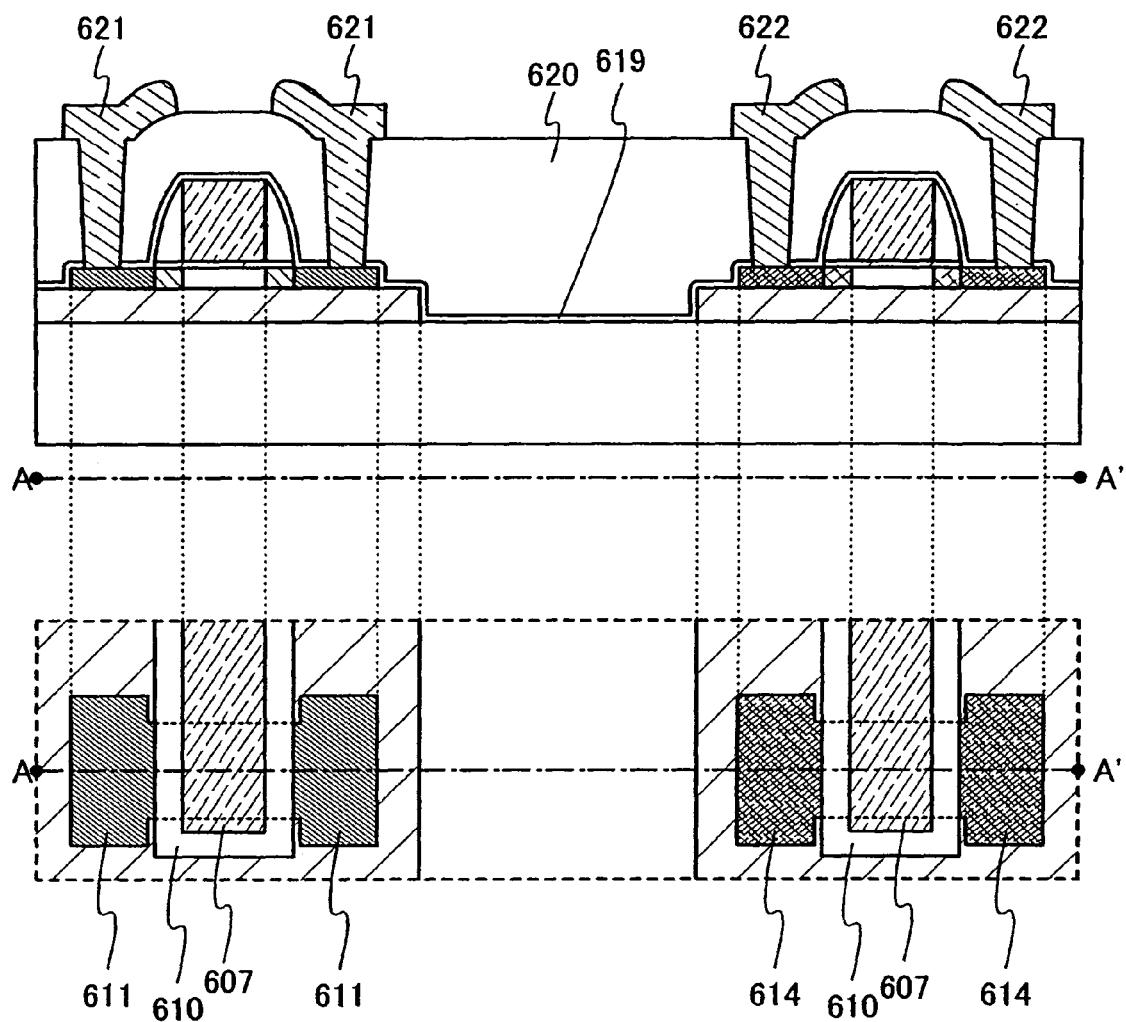
FIG. 13 is a cross-sectional view illustrating a manufacturing method of a semiconductor device according to the present invention.

Next, as illustrated in FIG. 13, contact holes are formed in the insulating films 619 and the insulating film 620 so that the island-shaped semiconductor films 603 and 604 are partially exposed. Then, the conductive films 621 and 622 are formed to be in contact with the island-shaped semiconductor films 603 and 604, respectively through the contact holes. Although a mixed gas of $CHF_3$ and He is used as a gas used for etching at the time of forming the contact holes, the gas is not limited to this mixed gas.

The conductive films 621 and 622 can be formed by a CVD method, a sputtering method, or the like. Specifically, the following can be used for the conductive films 621 and 622:

aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as its main component or a compound containing the above-described metal may be used. The conductive films 621 and 622 can be formed of a single layer of a film formed using the above-described metal or a layer in which a plurality of films each formed using the above-described metal is stacked.

As an example of an alloy containing aluminum as its main component, an alloy containing aluminum as its main component and also containing nickel is given. In addition, an alloy containing aluminum as its main component and also containing nickel and one or both of carbon and silicon can also be given as an example thereof. Since aluminum and aluminum silicon have low resistance values and are inexpensive, aluminum and aluminum silicon are suitable as a material for forming the conductive films 621 and 622. In particular, when the conductive films 621 and 622 are formed by patterning, generation of hillocks in resist baking can be prevented more in the case where an aluminum silicon (Al—Si) film is used than in the case where an aluminum film is used. Alternatively, Cu, instead of silicon (Si), may be mixed into the aluminum film at about 0.5 wt %.

For example, a stacked structure including a barrier film, an aluminum silicon (Al—Si) film, and a barrier film or a stacked structure including a barrier film, an aluminum silicon (Al—Si) film, a titanium nitride film, and a barrier film may be used for the conductive films 621 and 622. Note that the barrier film refers to a film formed using titanium, a nitride of titanium, molybdenum, or a nitride of molybdenum. When the barrier films are formed so that the aluminum silicon (Al—Si) film is interposed therebetween, generation of hillocks of aluminum or aluminum silicon can be further prevented. Moreover, when the barrier film is formed using titanium that is a highly-reducible element, even if a thin oxide film is formed over the island-shaped semiconductor films 603 and 604, the oxide film is reduced by the titanium contained in the barrier film, whereby preferable contact between the conductive films 621 and 622 and the island-shaped semiconductor films 603 and 604 can be obtained. Alternatively, a layer in which a plurality of barrier films is stacked may be used. In that case, for example, a five-layer structure in which titanium, titanium nitride, aluminum silicon, titanium, and titanium nitride are stacked from the lowest layer can be used for the conductive films 621 and 622.

Note that the conductive film 621 is connected to the high-concentration impurity region 611 of the n-channel transistor 617. The conductive film 622 is connected to the high-concentration impurity region 614 of the p-channel transistor 618.

FIG. 13 also illustrates a top view of the n-channel transistor 617 and the p-channel transistor 618. Note that the conductive films 621 and 622, the insulating film 619, and the insulating film 620 are omitted in FIG. 13.

In addition, although the case where each of the n-channel transistor 617 and the p-channel transistor 618 includes one electrode 607 functioning as the gate is shown as an example in this embodiment mode, the present invention is not limited to this structure. The transistor manufactured in the present invention may have a multi-gate structure in which a plurality of electrodes functioning as gates are included and electrically connected to one another.

Moreover, the transistor included in the semiconductor device manufactured in the present invention may have a gate planar structure.

This embodiment mode can be implemented in combination with any of the above embodiment modes as appropriate.

Embodiment 1

In Embodiment 1, procedures of transferring a semiconductor film a plurality of times to one base substrate to form a semiconductor display device, which is one kind of semiconductor devices, will be described.

Figure 14A:
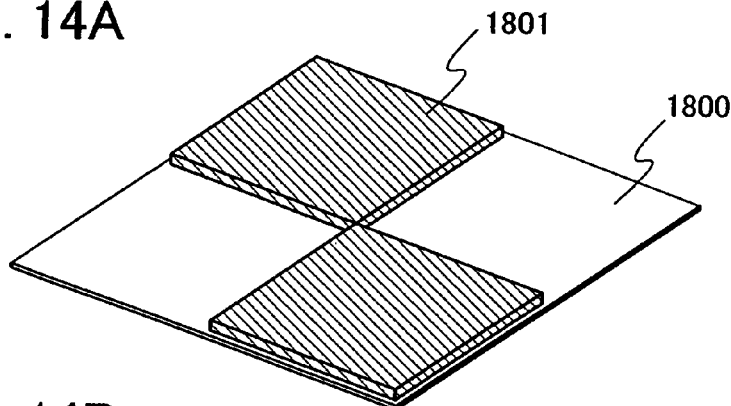
FIGS. 14A to 14D are perspective views illustrating a manufacturing method of a semiconductor display device according to the present invention.
Figure 14B:
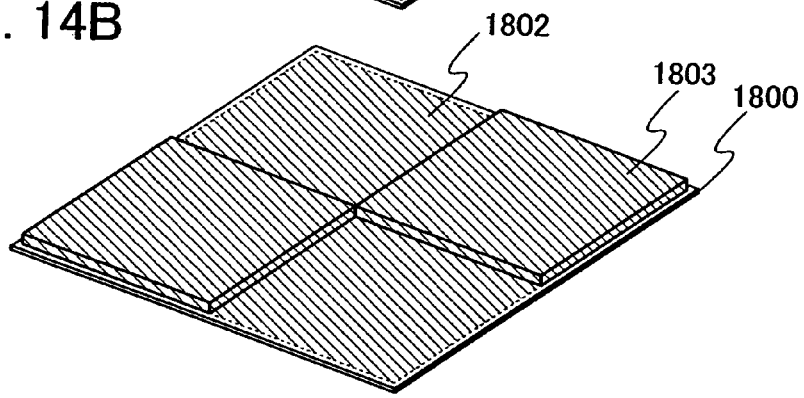
Figure 14C:
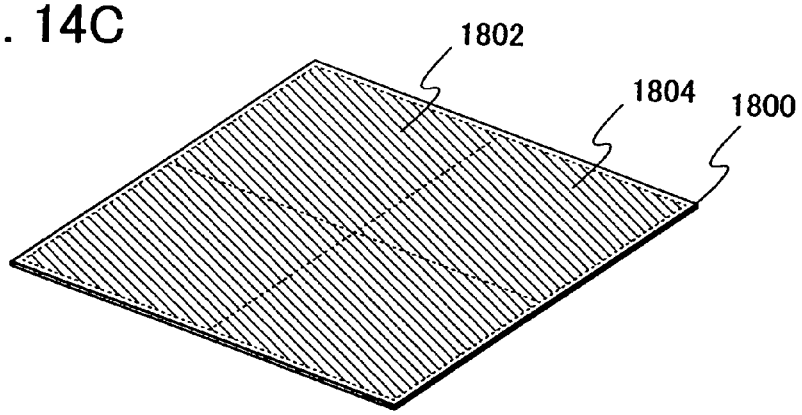

As illustrated in FIG. 14A, a plurality of bond substrates 1801 is bonded to a base substrate 1800. As illustrated in FIG. 14B, after semiconductor films 1802 are transferred to the base substrate 1800 from the bond substrates 1801, a plurality of bond substrates 1803 is bonded to the base substrate 1800. Note that an end portion of each of the bond substrates 1803 is partially removed to form projections, and the bond substrates 1803 are bonded to the base substrate 1800 so that the projections face the base substrate 1800 side. Then, as illustrated in FIG. 14C, semiconductor films 1804 are transferred to the base substrate 1800 from the bond substrates 1803.

Figure 14D:
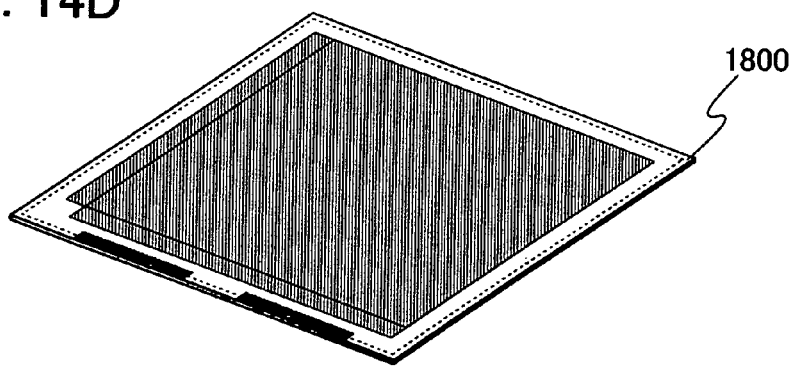

By forming a semiconductor element which uses the semiconductor films 1802 and the semiconductor films 1804 transferred to the base substrate 1800, an element substrate for a semiconductor display device can be formed as illustrated in FIG. 14D. Note that an "element substrate" corresponds to a substrate over which a semiconductor element for controlling pixel driving is formed. A display element for displaying gray scales may be formed between an element substrate and a counter substrate as in the case of a liquid crystal cell, or may be formed on the element substrate side as in the case of a light-emitting element. The element substrate is also included in the category of the semiconductor device of the present invention.

Since the distance between the semiconductor film 1802 transferred first and the semiconductor film 1804 transferred later can be as small as several tens of micrometers in the present invention, the transferred semiconductor film 1802 and the transferred semiconductor film 1804 can be used for one semiconductor device without the influence of the space between the semiconductor films.

Figure 15A:
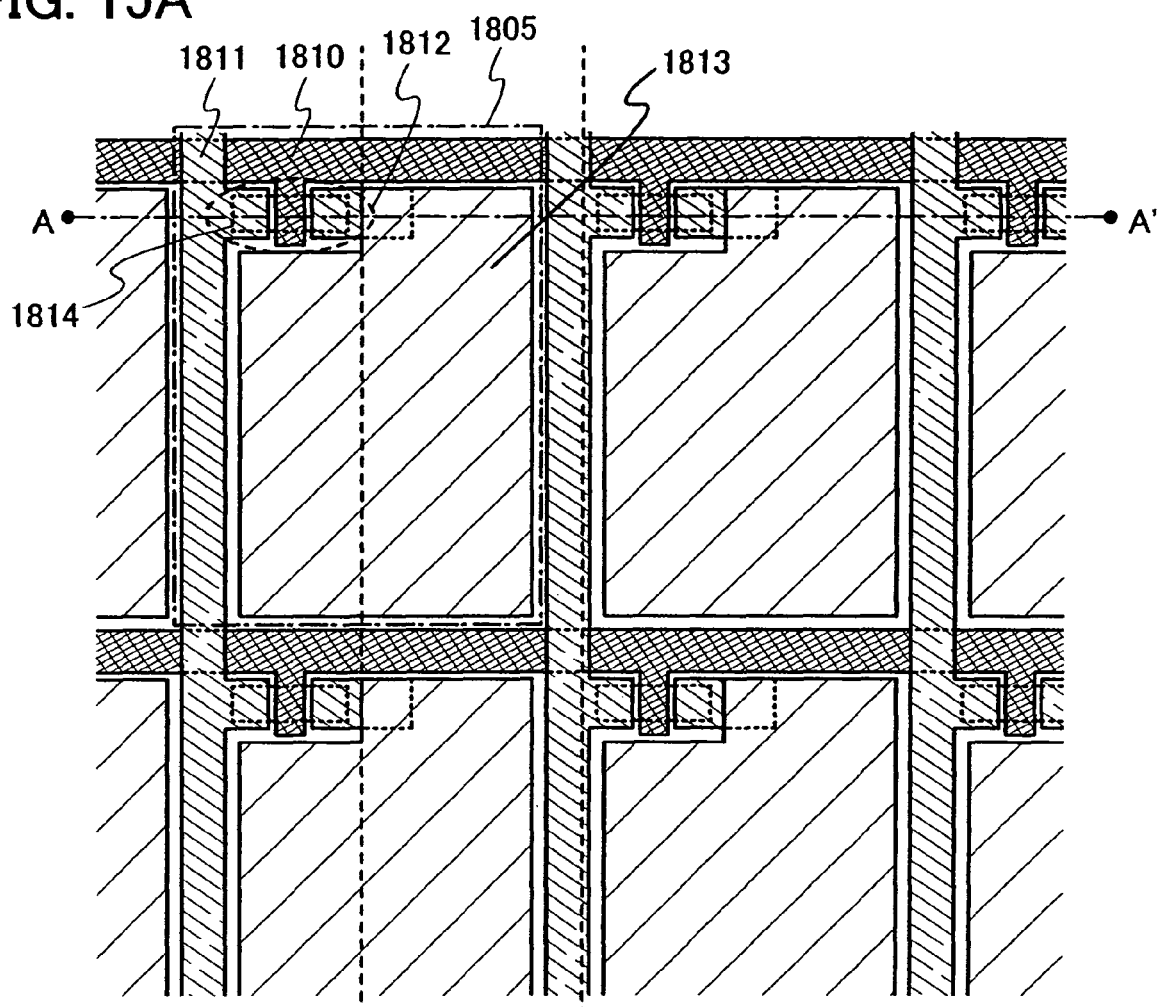
FIGS. 15A and 15B are a top view and a cross-sectional view of a pixel of a semiconductor display device manufactured using the present invention, respectively.
Figure 15B:
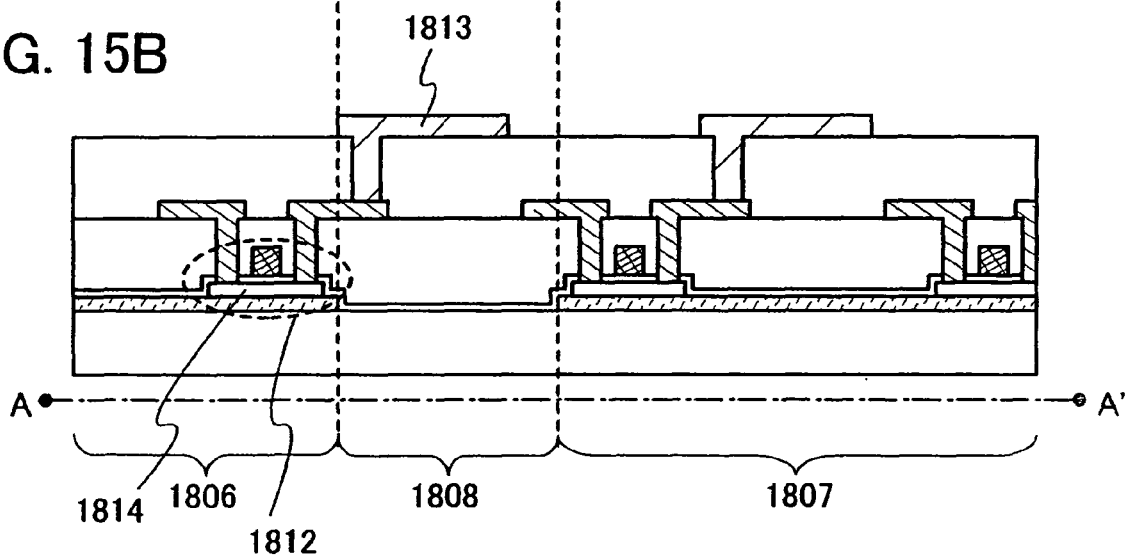

FIG. 15A illustrates an example of an enlarged view of a pixel of a liquid crystal display device for which the semiconductor film 1802 and the semiconductor film 1804 are used without the influence of the space between the semiconductor films. FIG. 15A is a top view of peripheral pixels which are adjacent to a pixel 1805, and FIG. 15B corresponds to a cross-sectional view taken along a broken line A-A' of the top view illustrated in FIG. 15A.

The pixel 1805 includes, at least, a scanning line 1810, a signal line 1811, a transistor 1812 functioning as a switching element, and a pixel electrode 1813. In addition, a region 1806 is a region to which the semiconductor film 1802 is transferred, a region 1807 is a region to which the semiconductor film 1804 is transferred, and a region 1808 is a region corresponding to the space between the semiconductor film 1802 and the semiconductor film 1804.

The transistor 1812 included in the pixel 1805 includes an island-shaped semiconductor film 1814 formed by patterning the semiconductor film 1802 which is transferred to the region 1806. The pixel 1805 overlaps with the region 1808. Note that in the liquid crystal display device illustrated in FIG. 15, since the distance between transistors is longer than the width of the region 1808, the pixel 1805 can be formed so as to overlap with the region 1808.

This embodiment can be implemented in combination with any of the above embodiment modes as appropriate.

Embodiment 2

In Embodiment 2, a structure of an active matrix semiconductor display device will be described, which is one kind of semiconductor devices which can be manufactured using the present invention.

An active matrix light-emitting device includes a light-emitting element which corresponds to a display element in each pixel. Since a light-emitting element emits light by itself, the light-emitting element has high visibility, dose not need a backlight which is necessary for a liquid crystal display device, is suitable for reduction in thickness, and does not have limitations on the viewing angle. Although a light-emitting device using an organic light-emitting diode (OLED) which is a kind of light-emitting element is described in this embodiment, the semiconductor display device manufactured in the present invention may be a light-emitting device using another light-emitting element.

An OLED includes a layer (hereinafter referred to as an electroluminescent layer) including a material with which luminescence (electroluminescence) generated by application of an electric field can be obtained, an anode layer, and a cathode layer. As electroluminescence, there are light emission obtained in returning to a ground state from a singlet excited state (fluorescence) and light emission obtained in returning to a ground state from a triplet excited state (phosphorescence). A light-emitting device of the present invention may use either one of fluorescence and phosphorescence or both fluorescence and phosphorescence.

FIG. 16A is a cross-sectional view of a light-emitting device of this embodiment. The light-emitting device illustrated in FIG. 16A includes a transistor 1601 and a transistor 1602 which are used in a driver circuit, and a driving transistor 1604 and a switching transistor 1603 which are used in a pixel, over an element substrate 1600. In addition, the light-emitting device illustrated in FIG. 16A includes a light-emitting element 1605 in the pixel over the element substrate 1600.

The light-emitting element 1605 includes a pixel electrode 1606, an electroluminescent layer 1607, and a counter electrode 1608. One of the pixel electrode 1606 and the counter electrode 1608 is an anode, and the other is a cathode.

For the anode, a light-transmitting conductive oxide material such as indium tin oxide containing silicon oxide (ITSO), indium tin oxide (ITO), zinc oxide (ZnO), indium zinc oxide (IZO), or gallium-doped zinc oxide (GZO) can be used. Alternatively, in addition to the above light-transmitting conductive oxide materials, the anode may be formed using, for example, a single-layer film containing one or more of titanium nitride, zirconium nitride, Ti, W, Ni, Pt, Cr, Ag, Al, and the like, a stacked-layer structure of a titanium nitride film and a film containing aluminum as its main component, or a three-layer structure of a titanium nitride film, a film containing aluminum as its main component, and a titanium nitride film. Note that, in the case of using a material other than the light-transmitting conductive oxide material and extracting light from the anode side, the anode is formed to a thickness thin enough to transmit light (preferably, about 5 nm to 30 nm).

A conductive composition including a conductive high molecule (also referred to as a conductive polymer) can be used for the anode. A conductive film which uses the conductive composition and serves as an anode preferably has a sheet resistance of equal to or less than 10000 Ω/square and a light transmittance of equal to or higher than 70% at a wavelength of 550 nm. Note that resistance of a conductive high molecule which is included in the conductive film is preferably equal to or lower than 0.1 Ω·cm.

As a conductive high molecule, a so-called π electron conjugated high molecule can be used. For example, polyaniline and/or a derivative thereof, polypyrrole and/or a derivative thereof, polythiophene and/or a derivative thereof, and a copolymer of two or more kinds of those materials can be given as the π electron conjugated high molecule.

Specific examples of a conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

Any of the foregoing conductive high molecules may be used alone as a conductive composition for the anode. Alternatively, any of the foregoing conductive high molecules can be used with an organic resin added thereto to adjust film characteristics such as the uniformity of the film thickness of the conductive composition or the film intensity of the conductive composition.

As for an organic resin, as long as a resin is compatible to a conductive high molecule or a resin can be mixed and dispersed into a conductive high molecule, a thermosetting resin, a thermoplastic resin, or a photocurable resin may be used. For example, the followings can be given: a polyester-based resin such as polyethylene terephthalate, polybutylene terephthalate, or polyethylene naphthalate; a polyimide-based resin such as polyimide or polyamide-imide; a polyamide resin such as polyamide 6, polyamide 66, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, and a copolymer of any of those resins.

Further, a conductive composition may be doped with an acceptor dopant or a donor dopant so that oxidation-reduction potential of a conjugated electron in a conjugated conductive high molecule may be changed in order to adjust conductivity of the conductive composition.

A halogen compound, a Lewis acid, a protonic acid, an organic cyano compound, an organic metal compound, or the like can be used as an acceptor dopant. Examples of a halogen compound are chlorine, bromine, iodine, iodine chloride, iodine bromide, and iodine fluoride. Examples of a Lewis acid are phosphorus pentafluoride, arsenic pentafluoride, antimony pentafluoride, boron trifluoride, boron trichloride, and boron tribromide. Examples of a protonic acid include an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As organic carboxylic acid and organic sulfonic acid, the foregoing carboxylic acid compound and the sulfonic acid compound can be used. As an organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene are given.

As a donor dopant, an alkali metal, an alkaline-earth metal, a quaternary amine compound, or the like can be used.

A conductive composition is dissolved in water or an organic solvent (e.g., an alcohol-based solvent, a ketone-based solvent, an ester-based solvent, a hydrocarbon-based solvent, an aromatic-based solvent) and a thin film which serves as an anode can be formed by a wet process.

A solvent which dissolves a conductive composition is not particularly limited. A solvent which dissolves the foregoing conductive high molecules and high molecular weight resin compounds such as an organic resin may be used. For example, a conductive composition may be dissolved in any one of or a mixture of water, methanol, ethanol, propylene carbonate, N-methylpyrrolidone, dimethylformamide, dimethylacetamide, cyclohexanone, acetone, methyl ethyl ketone, methyl isobutyl ketone, and toluene.

After the conductive composition is dissolved in a solvent as described above, a film thereof can be formed by a wet process, such as an application method, a coating method, a droplet discharge method (also referred to as an inkjet method), or a printing method. The solvent may be dried with thermal treatment or may be dried under reduced pressure. In the case where the organic resin is a thermosetting resin, heat treatment may be further performed. In the case where the organic resin is a photocurable resin, light irradiation treatment may be performed.

As a material for the cathode, a metal with a low work function, an alloy, a conductive compound, or a mixture thereof can be used. As specific examples, an alkali metal such as Li or Cs; an alkaline-earth metal such as Mg, Ca, or Sr; an alloy which includes any of those (such as Mg:Ag or Al:Li); or a rare earth metal such as Yb or Er can be used. Further, by formation of a layer containing a material having a high electron injection property so as to be in contact with the cathode, a normal conductive film formed of aluminum, a light-transmitting conductive oxide material, or the like can be used as well.

The electroluminescent layer 1607 may be formed using a single layer or by stacking a plurality of layers; in each layer, not only an organic material but also an inorganic material may be included. The luminescence in the electroluminescent layer 1607 includes light emission which is obtained in returning from a singlet excited state to the ground state (fluorescence), and light emission which is obtained in returning from a triplet excited state to the ground state (phosphorescence). When the electroluminescent layer 1607 is formed using a plurality of layers and if the pixel electrode 1606 is a cathode, the electroluminescent layer 1607 is formed by stacking an electron-injection layer, an electron-transport layer, a light-emitting layer, a hole-transport layer, and a hole-injection layer in this order over the pixel electrode 1606. Note that in the case where the pixel electrode 1606 corresponds to an anode, the electroluminescent layer 1607 is formed by stacking a hole-injection layer, a hole-transport layer, a light-emitting layer, an electron-transport layer, and an electron-injection layer in this order.

The electroluminescent layer 1607 can be formed by a droplet discharge method even when the electroluminescent layer 1607 is formed using any of a high molecular weight organic compound, an intermediate molecular weight organic compound (an organic compound which does not have a sublimation property but have a molecular chain length of 10 μm or less), a low molecular weight organic compound, or an inorganic compound. Further, the intermediate molecular weight organic compound, the low molecular weight organic compound, and the inorganic compound may also be formed by a vapor deposition method.

Note that each of the switching transistor 1603 and the driving transistor 1604 may have a multi-gate structure such as a double-gate structure or a triple-gate structure instead of a single-gate structure.

Next, FIG. 16B is a cross-sectional view of a liquid crystal display device of this embodiment. The liquid crystal display device illustrated in FIG. 16B includes a transistor 1611 and a transistor 1612 which are used in a driver circuit, and a transistor 1613 functioning as a switching element in a pixel, over an element substrate 1610. In addition, the liquid crystal display device illustrated in FIG. 16B includes a liquid crystal cell 1615 between the element substrate 1610 and a counter substrate 1614.

The liquid crystal cell 1615 includes a pixel electrode 1616 formed over the element substrate 1610, a counter electrode 1617 formed on the counter substrate 1614, and a liquid crystal 1618 provided between the pixel electrode 1616 and the counter electrode 1617. The pixel electrode 1616 can be formed using, for example, indium tin oxide containing silicon oxide (ITSO), indium tin oxide (ITO), zinc oxide (ZnO), indium zinc oxide (IZO), gallium-doped zinc oxide (GZO), or the like.

This embodiment can be implemented in combination with any of the above embodiment modes and embodiment as appropriate.

Embodiment 3

Figure 17:
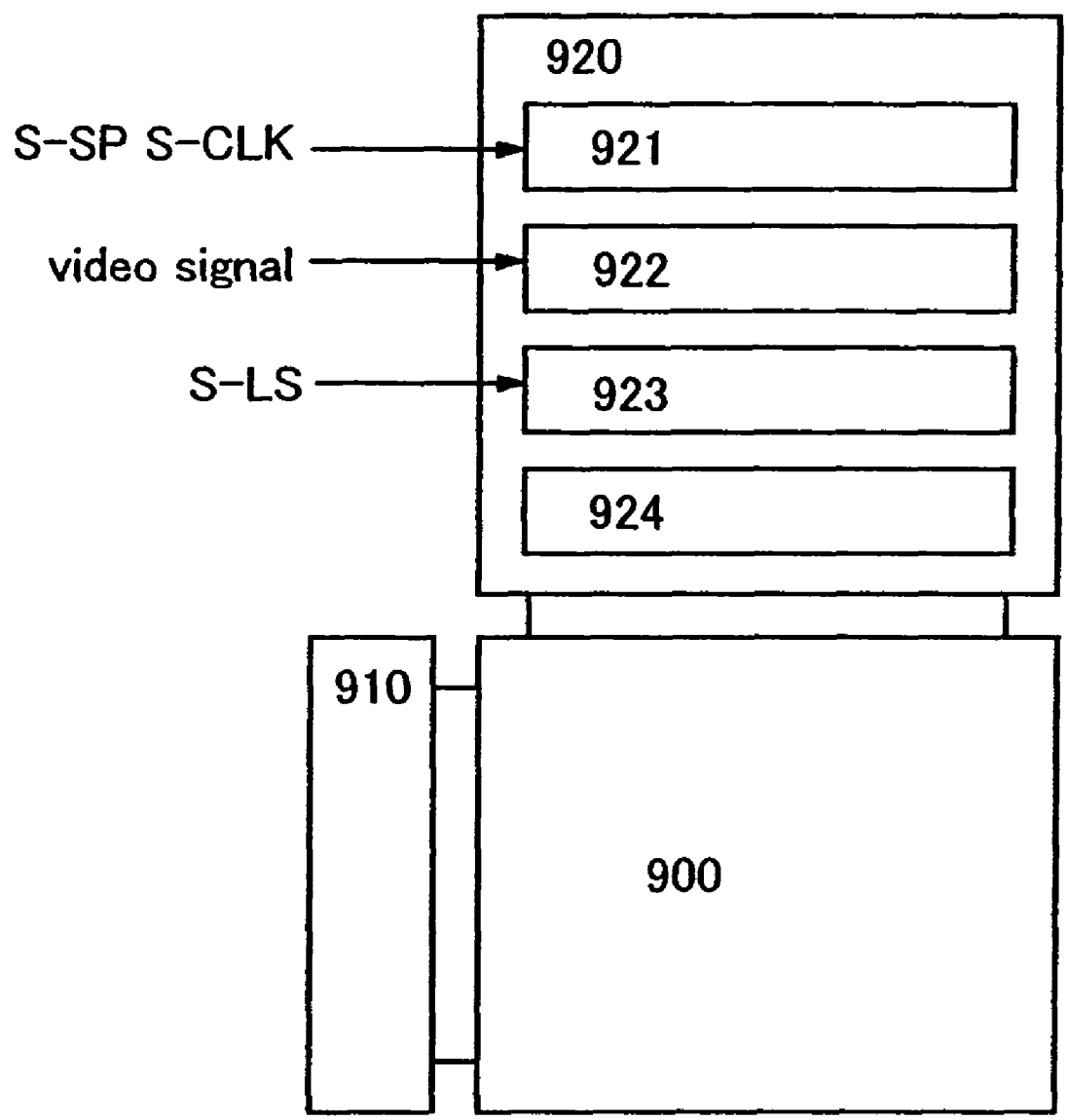
FIG. 17 is a block diagram of a structure of a semiconductor display device manufactured using the present invention.

In Embodiment 3, an overall structure of a semiconductor display device manufactured in the present invention will be described. FIG. 17 is a block diagram of an example of the semiconductor display device manufactured in the present invention.

The semiconductor display device illustrated in FIG. 17 includes a pixel portion 900 having a plurality of pixels, a scanning line driver circuit 910 for selecting pixels per line, and a signal line driver circuit 920 for controlling the input of a video signal to the pixels of a selected line.

In FIG. 17, the signal line driver circuit 920 includes a shift register 921, a first latch 922, a second latch 923, and a DA (digital to analog) converter circuit 924. A clock signal S-CLK and a start pulse signal S-SP are input to the shift register 921. The shift register 921 generates a timing signal of which pulse sequentially shifts in accordance with the clock signal S-CLK and the start pulse signal S-SP and outputs the timing signal to the first latch 922. The order of the appearance of the pulses of the timing signal may be switched in accordance with a scanning direction switching signal.

When a timing signal is input to the first latch 922, a video signal is sequentially written into and held in the first latch 922 in accordance with a pulse of the timing signal. Note that, although a video signal may be sequentially written into a plurality of memory circuits included in the first latch 922, a so-called division driving may be performed, in which the plurality of memory circuits included in the first latch 922 are divided into some groups and video signals are input to each group in parallel. Note that the number of groups at this time is called a division number. For example, in the case where a latch is divided into four groups of memory circuits, division driving is performed with four divisions.

The time until video signal writing into all of the memory circuits of the first latch 922 is completed is called a line period. In practice, the line period may include a period when a horizontal retrace interval is added to the above-defined line period.

When one line period is completed, the video signals held in the first latch 922 are written into the second latch 923 all at once and held in accordance with a pulse of a latch signal S-LS which is input to the second latch 923. The next video signal is sequentially written into the first latch 922 which has finished sending the video signals to the second latch 923, in accordance with a timing signal from the shift register 921 again. During this second round of the one line period, the video signals written into and held in the second latch 923 are input to the DA converter circuit 924.

The DA converter circuit 924 converts the input digital video signal to an analog video signal and inputs the analog video signal to each pixel in the pixel portion 900 through signal lines.

Note that the signal line driver circuit 920 may use another circuit which can output a signal of which pulse sequentially shifts, instead of the shift register 921.

Note that, although the pixel portion 900 is directly connected as the next stage to the DA converter circuit 924 in FIG. 17, the present invention is not limited to this structure. A circuit which performs signal processing on the video signal output from the DA converter circuit 924 can be provided at a stage prior to the pixel portion 900. As examples of the circuit which performs signal processing, a buffer which can shape a waveform, and the like can be given.

Next, operation of the scanning line driver circuit 910 is described. In the semiconductor display device manufactured in the present invention, a plurality of scanning lines is provided in each pixel in the pixel portion 900. The scanning line driver circuit 910 generates a selection signal and inputs the selection signal to each of the plurality of scanning lines, so that pixels are selected per line. When the pixels are selected with the selection signal, a transistor whose gate is connected to one of the scanning lines is turned on, and a video signal is input to the pixel.

Since the space between a plurality of transferred semiconductor films can be made small in the present invention, the pixel portion 900, the scanning line driver circuit 910, and the signal line driver circuit 920 can be all formed over the same base substrate.

This embodiment can be implemented in combination with any of the above embodiment modes and embodiments as appropriate.

Embodiment 4

Figure 18A:
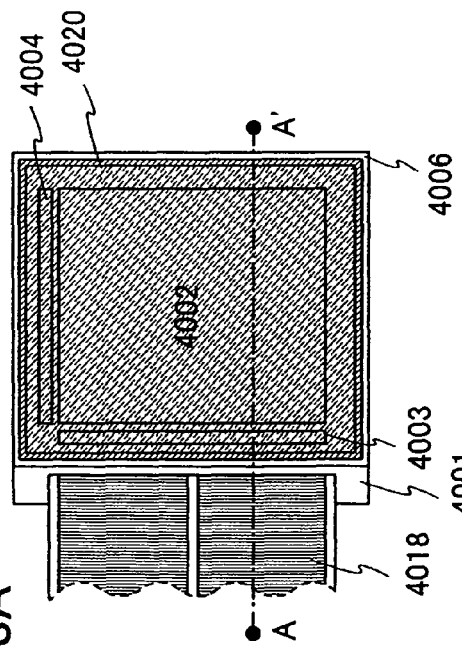
FIGS. 18A and 18B are a top view and a cross-sectional view of a semiconductor display device manufactured using the present invention, respectively.
Figure 18B:
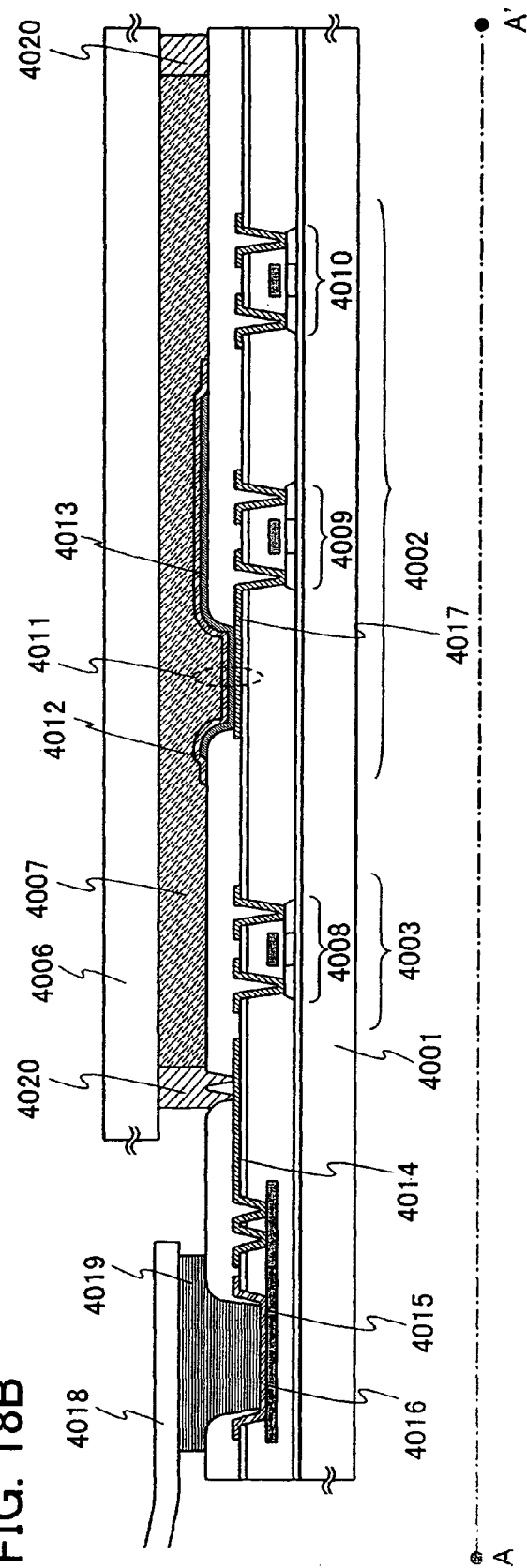

In Embodiment 4, an exterior view of a semiconductor display device manufactured in the present invention will be described with reference to FIGS. 18A and 18B. FIG. 18A is a top plan view of a panel in which a transistor and a light-emitting element formed over a base substrate are sealed between the base substrate and a sealing substrate by a sealant. FIG. 18B corresponds to a cross-sectional view taken along a line A-A' in FIG. 18A.

A sealant 4020 is provide so as to surround a pixel portion 4002, a signal line driver circuit 4003, and a scanning line driver circuit 4004 which are provided over a base substrate 4001. Further, a sealing substrate 4006 is provided over the pixel portion 4002, the signal line driver circuit 4003, and the scanning line driver circuit 4004. Thus, the pixel portion 4002, the signal line driver circuit 4003, and the scanning line driver circuit 4004 are sealed between the base substrate 4001 and the sealing substrate 4006 together with a filler 4007 by the sealant 4020.

Each of the pixel portion 4002, the signal line driver circuit 4003, and the scanning line driver circuit 4004 which are provided over the base substrate 4001 includes a plurality of transistors. FIG. 18B illustrates a transistor 4008 included in the signal line driver circuit 4003, and a driving transistor 4009 and a switching transistor 4010 which are included in the pixel portion 4002.

A light-emitting element 4011 uses part of a wiring 4017 connected to a source region or a drain region of the driving transistor 4009 as a pixel electrode. In addition, the light-emitting element 4011 includes a counter electrode 4012 and an electroluminescent layer 4013 as well as the pixel electrode. Note that the structure of the light-emitting element 4011 is not limited to the structure shown in this embodiment. The structure of the light-emitting element 4011 can be changed as appropriate in accordance with a direction of light extracted from the light-emitting element 4011, polarity of the driving transistor 4009, or the like.

Although various signals and voltages supplied to the pixel portion 4002, the signal line driver circuit 4003, or the scanning line driver circuit 4004 are not illustrated in the cross-sectional view of FIG. 18B, various signals and voltages are supplied from a connection terminal 4016 through extraction wirings 4014 and 4015.

In this embodiment, the connection terminal 4016 is formed using the same conductive film as the counter electrode 4012 included in the light-emitting element 4011. The extraction wiring 4014 is formed using the same conductive film as the wiring 4017. The extraction wiring 4015 is formed using the same conductive film as gate electrodes included in the driving transistor 4009, the switching transistor 4010, and the transistor 4008.

The connection terminal 4016 is electrically connected to a terminal included in an FPC 4018 through an anisotropic conductive film 4019.

Glass, metal (typically, stainless steel), ceramic, or plastic can be used for the sealing substrate 4006. Note that the sealing substrate 4006 located in the direction of light extracted from the light-emitting element 4011 necessarily has a light-transmitting property. Thus, a light-transmitting material such as a glass plate, a plastic plate, a polyester film, or an acryl film is preferably used for the sealing substrate 4006.

In addition, an ultraviolet curable resin or a thermosetting resin can be used for the filler 4007 as well as inert gas such as nitrogen or argon. In this embodiment, an example of using nitrogen for the filler 4007 is described.

This embodiment can be implemented in combination with any of the above embodiment modes and embodiments as appropriate.

Embodiment 5

Using the present invention, a semiconductor display device with a screen having a larger size can be manufactured with low cost. The semiconductor display device manufactured in the present invention is preferably used for display devices, laptop personal computers, and image reproducing devices provided with a recording medium (typically, a device for reproducing a content of a recording medium such as a digital versatile disc (DVD), which has a display for displaying the reproduced image). Further, as electronic devices which can use the semiconductor device manufactured in the present invention, cellular phones, portable game machines, electronic books, video cameras, digital still cameras, goggle displays (head mounted displays), navigation systems, audio reproducing devices (e.g., car audio components and audio components), and the like can be given. Specific examples of these electronic devices are illustrated in FIGS. 19A to 19C.

Figure 19A:
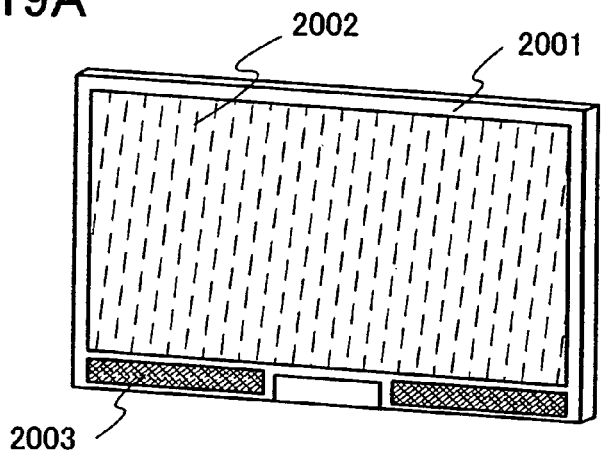
FIGS. 19A to 19C illustrate electronic devices which use a semiconductor device manufactured using the present invention.

FIG. 19A illustrates a display device, which includes a housing 2001, a display portion 2002, speaker portions 2003, and the like. The semiconductor display device manufactured in the present invention can be used for the display portion 2002. It is to be noted that the display device includes all devices for displaying information, for example, for a personal computer, for receiving TV broadcasting, and for displaying an advertisement. In addition, the semiconductor device manufactured in the present invention can be used as a signal processing circuit.

Figure 19B:
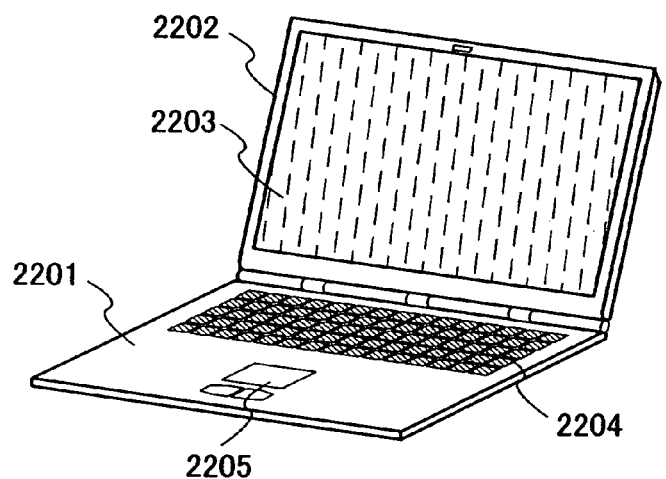

FIG. 19B illustrates a laptop personal computer, which includes a main body 2201, a housing 2202, a display portion 2203, a keyboard 2204, a mouse 2205, and the like. The semiconductor display device manufactured in the present invention can be used for the display portion 2203. In addition, the semiconductor device manufactured in the present invention can be used as a signal processing circuit.

Figure 19C:
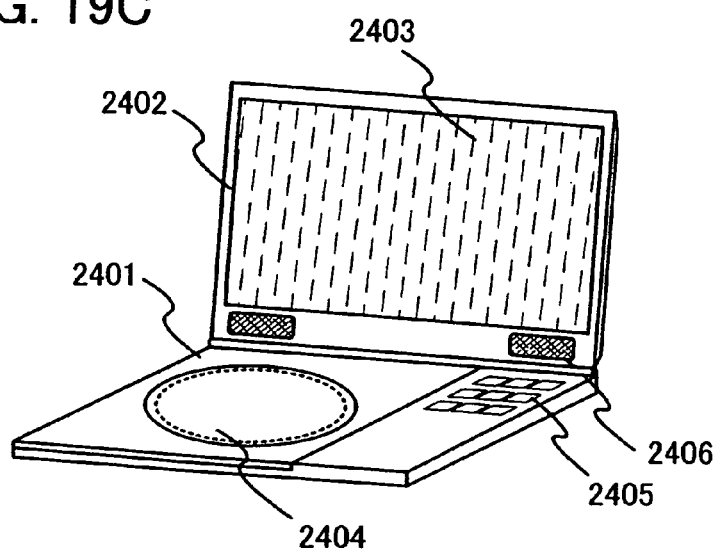

FIG. 19C illustrates a portable image reproducing device having a recording medium (specifically, a DVD player), which includes a main body 2401, a housing 2402, a display portion 2403, a recording medium (e.g. DVD) reading portion 2404, operation keys 2405, a speaker portion 2406, and the like. Note that the image reproducing device provided with a recording medium includes a home-use game machine and the like. The semiconductor display device manufactured in the present invention can be used for the display portion 2403. In addition, the semiconductor device manufactured in the present invention can be used as a signal processing circuit.

As described above, the application range of the present invention is extremely wide and the present invention can be applied to electronic devices in all fields.

This embodiment can be implemented in combination with any of the above embodiment modes and embodiments as appropriate.

This application is based on Japanese Patent Application serial no. 2007-170087 filed with Japan Patent Office on Jun. 28, 2007, the entire contents of which are hereby incorporated by reference.

EXPLANATION OF REFERENCE

100: bond substrate, 100a: bond substrate, 100b: bond substrate, 101: insulating film, 102: fragile layer, 103: insulating film, 104: base substrate, 105a: projection, 105b: projection, 106a: semiconductor film, 106b: semiconductor film, 107: broken line, 108: semiconductor film, 200: base substrate, 201: bond substrate, 202: projection, 203: broken line, 204: semiconductor film, 205: bond substrate, 206: projection, 207: semiconductor film, 300: base substrate, 301: bond substrate, 302: projection, 303: broken line, 304: semiconductor film, 305: bond substrate, 306: projection, 307: semiconductor film, 400: base substrate, 401: bond substrate, 402: projection, 404: semiconductor film, 405: bond substrate, 406: projection, 407: semiconductor film, 408: bond substrate, 409: projection, 410: semiconductor film, 500: bond substrate, 500a: bond substrate, 500b: bond substrate, 501: insulating film, 502: fragile layer, 503: insulating film, 504: base substrate, 505a: projection, 505b: projection, 506a: semiconductor film, 506b: semiconductor film, 508: semiconductor film, 510: semiconductor film, 511: semiconductor film, 512: semiconductor film, 601: base substrate, 602: insulating film, 603: semiconductor film, 604: semiconductor film, 606: gate insulating film, 607: electrode, 608: impurity region, 609: impurity region, 610: sidewall, 611: high-concentration impurity region, 612: low-concentration impurity region, 613: channel formation region, 614: high-concentration impurity region, 615: low-concentration impurity region, 616: channel formation region, 617: transistor, 618: transistor, 619: insulating film, 620: insulating film, 621: conductive film, 622: conductive film, 900: pixel portion, 910: scanning line driver circuit, 920: signal line driver circuit, 921: shift register, 922: latch, 923: latch, 924: DA converter circuit, 1600: element substrate, 1601: transistor, 1602: transistor, 1603: switching transistor, 1604: driving transistor, 1605: light-emitting element, 1606: pixel electrode, 1607: electroluminescent layer, 1608: counter electrode, 1610: element substrate, 1611: transistor, 1612: transistor, 1613: transistor, 1614: counter substrate, 1615: liquid crystal cell, 1616: pixel electrode, 1617: counter electrode, 1618: liquid crystal, 1800: base substrate, 1801: bond substrate, 1802: semiconductor film, 1803: bond substrate, 1804: semiconductor film, 1805: pixel, 1806: region, 1807: region, 1808: region, 1810: scanning line, 1811: signal line, 1812: transistor, 1813: pixel electrode, 1814: semiconductor film, 2001: housing, 2002: display portion, 2003: speaker portion, 2201: main body, 2202: housing, 2203: display portion, 2204: keyboard, 2205: mouse, 2401: main body, 2402: housing, 2403: display portion, 2404: recording medium reading portion, 2405: operation key, 2406: speaker portion, 4001: base substrate, 4002: pixel portion, 4003: signal line driver circuit, 4004: scanning line driver circuit, 4006: sealing substrate, 4007: filler, 4008: transistor, 4009: driving transistor, 4010: switching transistor, 4011: light-emitting element, 4012: counter electrode, 4013: electroluminescent layer, 4014: wiring, 4015: wiring, 4016: connection terminal, 4017: wiring, 4018: FPC, 4019: anisotropic conductive film, and 4020: sealant.

The invention claimed is:

1. A manufacturing method of a semiconductor device, comprising the steps of:
  bonding a first bond substrate which is provided with a first projection and a second bond substrate which is provided with a second projection to a base substrate;
  dividing the first bond substrate and the second bond substrate so that a first semiconductor film which is part of the first projection and a second semiconductor film which is part of the second projection are provided over the base substrate;
  bonding a third bond substrate which is provided with a third projection to the base substrate so that a region of the third bond substrate other than the third projection overlaps with the first semiconductor film and the second semiconductor film after dividing the first bond substrate and the second bond substrate; and
  dividing the third bond substrate so that a third semiconductor film which is part of the third projection is provided over the base substrate,
  wherein the first projection is formed by partially removing an end portion of the first bond substrate,
  wherein the second projection is formed by partially removing an end portion of the second bond substrate, and
  wherein the third projection is formed by partially removing an end portion of the third bond substrate.

2. A manufacturing method of a semiconductor device, comprising the steps of:

bonding a first bond substrate which is provided with a first projection and a second bond substrate which is provided with a second projection to a base substrate;

dividing the first bond substrate and the second bond substrate so that a first semiconductor film which is part of the first projection and a second semiconductor film which is part of the second projection are provided over the base substrate;

bonding a third bond substrate which is provided with a third projection to the base substrate so that a region of the third bond substrate other than the third projection overlaps with the first semiconductor film and the second semiconductor film after dividing the first bond substrate and the second bond substrate; and dividing the third bond substrate so that a third semiconductor film which is part of the third projection is provided over the base substrate, wherein the first projection is formed by partially removing an end portion of the first bond substrate, wherein the second projection is formed by partially removing an end portion of the second bond substrate, wherein the third projection is formed by partially removing an end portion of the third bond substrate, and wherein a width of the third projection in a perpendicular direction to the third bond substrate is larger than a thickness of the first semiconductor film.

3. A manufacturing method of a semiconductor device, comprising the steps of:

bonding a first bond substrate which is provided with a first projection and a second bond substrate which is provided with a second projection to a base substrate;

dividing the first bond substrate and the second bond substrate so that a first semiconductor film which is part of the first projection and a second semiconductor film which is part of the second projection are provided over the base substrate;

bonding a third bond substrate which is provided with a third projection to the base substrate so that a region of the third bond substrate other than the third projection overlaps with the first semiconductor film and the second semiconductor film after dividing the first bond substrate and the second bond substrate;

dividing the third bond substrate so that a third semiconductor film which is part of the third projection is provided over the base substrate;

forming a fourth semiconductor film at least between the first semiconductor film and the third semiconductor film; and crystallizing the fourth semiconductor film by epitaxial growth, wherein the first projection is formed by partially removing an end portion of the first bond substrate, wherein the second projection is formed by partially removing an end portion of the second bond substrate, and wherein the third projection is formed by partially removing an end portion of the third bond substrate.

4. The manufacturing method of a semiconductor device according to claim 1,
wherein an insulating film is formed on the first projection using hydroxylation or plasma oxidation, and
wherein the first bond substrate is bonded to the base substrate with the insulating film interposed therebetween.

5. The manufacturing method of a semiconductor device according to claim 2,
wherein an insulating film is formed on the first projection using hydroxylation or plasma oxidation, and
wherein the first bond substrate is bonded to the base substrate with the insulating film interposed therebetween.

6. The manufacturing method of a semiconductor device according to claim 3,
wherein an insulating film is formed on the first projection using hydroxylation or plasma oxidation, and
wherein the first bond substrate is bonded to the base substrate with the insulating film interposed therebetween.

7. The manufacturing method of a semiconductor device according to claim 1,
wherein an insulating film is formed on the third projection using hydroxylation or plasma oxidation, and
wherein the third bond substrate is bonded to the base substrate with the insulating film interposed therebetween.

8. The manufacturing method of a semiconductor device according to claim 2,
wherein an insulating film is formed on the third projection using hydroxylation or plasma oxidation, and
wherein the third bond substrate is bonded to the base substrate with the insulating film interposed therebetween.

9. The manufacturing method of a semiconductor device according to claim 3,
wherein an insulating film is formed on the third projection using hydroxylation or plasma oxidation, and
wherein the third bond substrate is bonded to the base substrate with the insulating film interposed therebetween.

10. A manufacturing method of a semiconductor device, comprising the steps of:

bonding a first bond substrate which is provided with a first projection to a base substrate;

dividing the first bond substrate so that a first semiconductor film which is part of the first projection is provided over the base substrate;

bonding a second bond substrate which is provided with a second projection to the base substrate so that a region of the second bond substrate other than the second projection overlaps with the first semiconductor film;

dividing the second bond substrate so that a second semiconductor film which is part of the second projection is provided over the base substrate;

bonding a third bond substrate which is provided with a third projection to the base substrate so that a region of the third bond substrate other than the third projection overlaps with the first semiconductor film and the second semiconductor film; and dividing the third bond substrate so that a third semiconductor film which is part of the third projection is provided over the base substrate, wherein the first projection is formed by partially removing an end portion of the first bond substrate, wherein the second projection is formed by partially removing an end portion of the second bond substrate, wherein the third projection is formed by partially removing an end portion of the third bond substrate, and wherein the first projection, the second projection, and the third projection have a regular hexagonal shape.

11. A manufacturing method of a semiconductor device, comprising the steps of:

bonding a first bond substrate which is provided with a first projection to a base substrate;

dividing the first bond substrate so that a first semiconductor film which is part of the first projection is provided over the base substrate;

bonding a second bond substrate which is provided with a second projection to the base substrate so that a region of the second bond substrate other than the second projection overlaps with the first semiconductor film;

dividing the second bond substrate so that a second semiconductor film which is part of the second projection is provided over the base substrate;

bonding a third bond substrate which is provided with a third projection to the base substrate so that a region of the third bond substrate other than the third projection overlaps with the first semiconductor film and the second semiconductor film; and dividing the third bond substrate so that a third semiconductor film which is part of the third projection is provided over the base substrate, wherein the first projection is formed by partially removing an end portion of the first bond substrate, wherein the second projection is formed by partially removing an end portion of the second bond substrate, wherein the third projection is formed by partially removing an end portion of the third bond substrate, wherein each of a width of the second projection in a perpendicular direction to the second bond substrate and a width of the third projection in a perpendicular direction to the third bond substrate is larger than a thickness of the first semiconductor film, and wherein the first projection, the second projection, and the third projection have a regular hexagonal shape.

12. The manufacturing method of a semiconductor device according to claim 10,
wherein an insulating film is formed on the first projection using hydroxylation or plasma oxidation, and
wherein the first bond substrate is bonded to the base substrate with the insulating film interposed therebetween.

13. The manufacturing method of a semiconductor device according to claim 11,
wherein an insulating film is formed on the first projection using hydroxylation or plasma oxidation, and
wherein the first bond substrate is bonded to the base substrate with the insulating film interposed therebetween.

14. The manufacturing method of a semiconductor device according to claim 10,
wherein an insulating film is formed on the second projection using hydroxylation or plasma oxidation, and
wherein the second bond substrate is bonded to the base substrate with the insulating film interposed therebetween.

15. The manufacturing method of a semiconductor device according to claim 11,
wherein an insulating film is formed on the second projection using hydroxylation or plasma oxidation, and
wherein the second bond substrate is bonded to the base substrate with the insulating film interposed therebetween.

16. The manufacturing method of a semiconductor device according to claim 10,
wherein an insulating film is formed on the third projection using hydroxylation or plasma oxidation, and
wherein the third bond substrate is bonded to the base substrate with the insulating film interposed therebetween.

17. The manufacturing method of a semiconductor device according to claim 11,
wherein an insulating film is formed on the third projection using hydroxylation or plasma oxidation, and
wherein the third bond substrate is bonded to the base substrate with the insulating film interposed therebetween.

18. The manufacturing method of a semiconductor device according to claim 1,
wherein division of the first bond substrate is caused at a fragile layer by selectively heating the first bond substrate using dielectric heating with a microwave after forming the fragile layer in the first bond substrate by doping.

19. The manufacturing method of a semiconductor device according to claim 2,
wherein division of the first bond substrate is caused at a fragile layer by selectively heating the first bond substrate using dielectric heating with a microwave after forming the fragile layer in the first bond substrate by doping.

20. The manufacturing method of a semiconductor device according to claim 3,
wherein division of the first bond substrate is caused at a fragile layer by selectively heating the first bond substrate using dielectric heating with a microwave after forming the fragile layer in the first bond substrate by doping.

21. The manufacturing method of a semiconductor device according to claim 10,
wherein division of the first bond substrate is caused at a fragile layer by selectively heating the first bond substrate using dielectric heating with a microwave after forming the fragile layer in the first bond substrate by doping.

22. The manufacturing method of a semiconductor device according to claim 11,
wherein division of the first bond substrate is caused at a fragile layer by selectively heating the first bond substrate using dielectric heating with a microwave after forming the fragile layer in the first bond substrate by doping.

* * * * *